United States Patent
Wild et al.

(10) Patent No.: US 11,125,827 B2
(45) Date of Patent: Sep. 21, 2021

(54) METHOD AND APPARATUS FOR DETERMINING THE STATE OF HEALTH AND STATE OF CHARGE OF LITHIUM SULFUR BATTERIES

(71) Applicant: Oxis Energy Limited, Abingdon (GB)

(72) Inventors: Mark Wild, Abingdon (GB); Greg Offer, Greater London (GB); Monica Marinescu, Greater London (GB); Daniel Auger, Bedfordshire (GB); Abbas Fotouhi, Bedfordshire (GB); Geraint Minton, Abingdon (GB)

(73) Assignee: Oxis Energy Limited, Abingdon (GB)

( * ) Notice: Subject to any disclaimer, the term of this patent is extended or adjusted under 35 U.S.C. 154(b) by 606 days.

(21) Appl. No.: 15/566,661

(22) PCT Filed: Apr. 18, 2016

(86) PCT No.: PCT/GB2016/051066
§ 371 (c)(1),
(2) Date: Oct. 13, 2017

(87) PCT Pub. No.: WO2016/166555
PCT Pub. Date: Oct. 20, 2016

(65) Prior Publication Data
US 2018/0095141 A1   Apr. 5, 2018

(30) Foreign Application Priority Data
Apr. 16, 2015   (GB) ...................................... 1506497

(51) Int. Cl.
*G01R 31/392*   (2019.01)
*G01R 31/367*   (2019.01)
(Continued)

(52) U.S. Cl.
CPC ............ *G01R 31/392* (2019.01); *B60L 58/12* (2019.02); *G01C 21/3407* (2013.01);
(Continued)

(58) Field of Classification Search
CPC ........... B60L 2240/545; B60L 2260/44; B60L 58/12; G01R 31/367; G01R 31/396;
(Continued)

(56) References Cited

U.S. PATENT DOCUMENTS 7,019,494 B2   3/2006   Mikhaylik
7,072,871 B1 *  7/2006   Tinnemeyer ......... G01R 31/367
                                                    706/1
(Continued)

FOREIGN PATENT DOCUMENTS

CN   101656334   11/2012
CN   103176139   6/2013
(Continued)

OTHER PUBLICATIONS

Search Report for United Kingdom Application No. GB1506497.5 dated May 5, 2016, 2 pages.
(Continued)

*Primary Examiner* — Kyle R Quigley
(74) *Attorney, Agent, or Firm* — Seyfarth Shaw LLP

(57) ABSTRACT

Systems and methods for accurately determining the state of health (including state of charge and relative age) of a Lithium Sulfur battery, module or cell. The invention uses an operational model of a Lithium Sulfur cell or battery to predict model parameters under a range of conditions related to state of charge and state of health. Operational models include the memory effect due to the unique chemistry of a Lithium Sulfur cell that precludes the user of other methodologies for State of health determination for Lithium Sulfur batteries. Model parameters are identified in real life
(Continued)

applications and parameters are compared to those of the operational Lithium Sulfur model employing Kalman filtering. The output includes an estimate of state of health and other key performance indicators. Key performance indicators are compared with measured values of for example resistance to provide feedback to the estimate process in order to improve accuracy. The system can be implemented as software or firmware in an application.

21 Claims, 18 Drawing Sheets

(51) Int. Cl.
*H01M 10/48* (2006.01)
*B60L 58/12* (2019.01)
*G01C 21/34* (2006.01)
*H01M 10/052* (2010.01)

(52) U.S. Cl.
CPC ........ G01R 31/367 (2019.01); H01M 10/052 (2013.01); H01M 10/48 (2013.01)

(58) Field of Classification Search
CPC .............. G01R 31/3842; G01R 31/392; G01C 21/3407; H01M 10/052; H01M 10/48
See application file for complete search history.

(56) References Cited

U.S. PATENT DOCUMENTS

| | | | |
|---|---|---|---|
| 7,688,075 | B2 | 3/2010 | Kelley |
| 8,332,342 | B1* | 12/2012 | Saha .................... G01R 31/392 706/45 |
| 8,515,655 | B2 | 8/2013 | Fushiki et al. |
| 2004/0162683 | A1 | 8/2004 | Verbrugge et al. |
| 2009/0210179 | A1 | 8/2009 | Tang |
| 2012/0053825 | A1* | 3/2012 | Schunder ........... G01C 21/3469 701/123 |
| 2013/0096858 | A1 | 4/2013 | Amano et al. |
| 2013/0218496 | A1 | 8/2013 | Koch et al. |
| 2013/0311116 | A1 | 11/2013 | Chaturvedi et al. |
| 2014/0203813 | A1* | 7/2014 | Driemeyer-Franco ....................... B60L 58/12 324/434 |
| 2014/0326043 | A1* | 11/2014 | Wegner .................. B60L 58/16 73/23.37 |

FOREIGN PATENT DOCUMENTS

| | | |
|---|---|---|
| JP | 2008538608 | 10/2008 |
| JP | 2011075382 | 4/2011 |

OTHER PUBLICATIONS

Examination Report for United Kingdom Application No. GB1506497.5 dated May 5, 2016, 3 pages.
International Search Report for Application No. PCT/GB2016/051066 dated Jul. 18, 2016, 15 pages.
Risse Sebastian et al., "Capacity fading in lithium/sulfur batteries: A linear four-state model," Journal of Power Sources, vol. 267, Dec. 1, 2014, pp. 648-654.
Gagneur et al., "Lithium-Ion state of charge observer with open circuit voltage hysteresis model," May 30, 2013, 7 pages.
Baronti et al., "Experimental Analysis of Open-Circuit Voltage Hysteresis in Lithium-Iron Phosphate Batteries," 2013, 6 pages.
Chun et al., "A Fast State-of_Charge Estimation Algorithm for LiFePO4 Batteries Utilizing Extended Kalman Filter," 2013, 5 pages.
Agroudi Naglaa et al: "New Hybrid battery model that takes into account both electric circuit characteristics and non-linear battery properties" 2013 IEEE 20th International Conference on Electronics, Circuits, and Systems (ICECS) IEEE, Dec. 8, 2013, pp. 289-292.
Matteo Corno et al: "A diffusive electro-equivalent Li-ion battery model" Circuits and Systems (ISCAS), 2013 IEEE International Symposium on, IEEE, May 19, 2013, pp. 2976-2979.
European Search Report for Application No. 19189248.8 dated Mar. 27, 2020, 7 pages.
Mahmoudreza Ghaznavi et al: "Sensitivity analysis of a mathematical model of lithium-sulfur cells: Part II Precipitation reaction kinetics and sulfur content", Journal of Power Sources, Elsevier SA, CH, vol. 257, Jan. 31, 2014, pp. 402-411.
Mahmoudreza Ghaznavi et al: "Sensitivity analysis of a mathematical model of lithium-sulfur cells: Part 1: Precipitation reaction kinetics and sulfur content", Journal of Power Sources, Elsevier SA, Ch, vol. 257, Nov. 8, 2013, pp. 394-401.

\* cited by examiner

METHOD AND APPARATUS FOR DETERMINING THE STATE OF HEALTH AND STATE OF CHARGE OF LITHIUM SULFUR BATTERIES

CROSS REFERENCE TO RELATED APPLICATIONS

This is a National Stage application of PCT/GB2016/051066, filed Apr. 18, 2016, and claims priority to United Kingdom Patent Application s/n GB 1506497.5, filed Apr. 16, 2015, the disclosures of which are incorporated herein by reference.

TECHNICAL FIELD

The present invention relates generally to methods and apparatuses for determining state of charge and state of health of a secondary cell that is susceptible to the memory effect of a change in capacity due to dynamic cycling of the cell in normal use. The present invention finds particular utility in cells having a Lithium Sulfur chemistry. The present invention also relates to applications of the methods and apparatuses in battery management systems and energy system controllers, and in rangefinding and routefinding apparatuses and methods for use in electric vehicles.

BACKGROUND

The ability to reliably determine the amount of remaining charge of a secondary cell providing a rechargeable battery for use as a power source in, for example, portable electronic goods and electric vehicle transport is highly valued by manufacturers and consumers alike in order to calculate the remaining usage time or available distance for vehicles.

In the case of gasoline vehicles the fuel level can simply be measured, however in electric and hybrid vehicles and in electronic devices because the battery is used as their power source it is more difficult to measure residual energy accumulated in the battery. Despite this difficulty various techniques have been developed.

An important metric for determining secondary cells is therefore State of charge, SOC, which indicates the remaining energy stored in a rechargeable battery until recharge is required. State of discharge, conversely, indicates the energy provided by the rechargeable battery since the last recharge.

Specifically, SOC is a percentage indicator of the amount of capacity remaining in a cell until a recharge is needed, compared to the total capacity provided by that cell in that charge cycle, $Q_t$. Supposing $SOC_0$ to be the initial SOC percentage at time $t_0$, the cell's SOC percentage at time t is defined as:

$$SOC = SOC_0 + 100 * \int_{t_0}^{t} \frac{I(t)}{Q_t} dt$$

where I is the current, which is defined as negative for discharging and positive for charging, and $Q_t$ is the cell's maximum capacity in Ah.

Thus in order to track and determine SOC it is necessary to set an initial value $SOC_0$ of the State of Charge. In Lithium ion and other rechargeable battery types this is usually achieved with reference to the maximum open circuit voltage (OCV) prior to discharging the cell or battery. However, for certain cell types as will be explained below, notably Lithium Sulfur cells, the OCV is affected by a very strong "memory effect" (i.e. hysteresis), also known as a "cumulative memory effect", which means that the maximum open circuit voltage (OCV) can be achieved at very different SOCs depending on the cell's recent history.

In this regard, Lithium Sulfur chemistry offers unique challenges for state of charge estimation compared to other rechargeable batteries types. For example, as can be seen from the illustrative plot of OCV against state of charge for an example Lithium Sulfur cell as shown in FIG. 1, the discharge curve is not linear, like in Lithium Ion cells. Instead, the LiS cell OCV curve exhibits, from a 100% SOC, a short capacity high plateau 101 at a fairly constant OCV followed by a rapid change 102 to a long capacity "low" plateau at 103 of constant OCV around 2.15V, which continues until the OCV drops rapidly 104 as the cell approaches 0% SOC. The long plateau at 103 effectively precludes the direct use of OCV for reliable SOC determination for Lithium Sulfur rechargeable batteries.

Others attempts have been made to improve the accuracy of the initial SOC determination, including using resistance and temperature measurements to improve accuracy in real life applications, but even this does not work because the internal resistance of Lithium Sulfur cells is strongly affected by the abovementioned "memory effect" and it is not always possible to return the cell to a known state before the next discharge.

Another known method that does not require knowledge of the starting capacity involves coulomb counting to determine the amount of energy used during discharge or stored during charge. However, Lithium Sulfur cells have parasitic reactions during charging which means the Faradaic efficiency is significantly less than 100%. This shuttling of polysulfides dissolved in the electrolyte during charging avoids overcharging but precludes the use of coulomb counting in SOC determination, so coulomb counting does not work for LiS cells.

U.S. Pat. No. 7,688,075 B2 discloses using calibrated Lithium Sulfur cells and linear correlation with embedded look up tables of SOC verses resistance populated from extensive laboratory studies on standard cells at varying temperatures and ages. This method utilises a unique feature of Lithium Sulfur cell chemistry in that it causes a predictable and gradual change in resistance during discharge unlike Lithium ion cells. This method relies on determining the resistance of the cell at 100% SOC by taper charging, charging to a maximum voltage and then reducing current to sustain that voltage until the current is equal to a predetermined constant minimum current. This provides a precise measure of SOC under well-defined conditions.

BRIEF SUMMARY OF THE INVENTION

The present inventors have recognised that the above methods do not take into account another unique feature of Lithium Sulfur chemistry which is that, under dynamic use conditions, the parameter $Q_t$ changes in a wide range due to active species becoming temporarily inactive in use.

The mechanism for this is that the active cathode material (Sulfur) dissolves into the electrolyte unlike in Lithium ion batteries. The maximum capacity ($Q_t$) at 100% SOC or state of discharge (SOD) for any charge cycle is determined by the conversion of active Sulfur in the cathode to Lithium sulphide plus the conversion of intermediates remaining in the electrolyte from previous cycles. The concentration of intermediates in the electrolyte from previous cycles is determined by the temperature, charge/discharge rates and depths of charge or discharge of previous cycles (i.e. the operational conditions).

Thus, in order to obtain a state of health that is both precise and accurate in a dynamic or real life system, the present inventors have recognised that the history of the cell must be taken in to account in the state of health calculation.

Here, state of health, SoH, is a figure of merit that combines the remaining energy stored in a rechargeable battery and the aging effects of use of the rechargeable battery related to the remaining life of the rechargeable battery in terms of calendar life and/or cycle life.

Specifically, SoH is a percentage indicator of the maximum usable capacity (measured in Amp-hours Ah) in any given charge cycle, $Q_{usable}$ (i.e. $Q_t$ for that cycle, compensating for temporarily inactive and optionally also permanently inactive species), compared to the total rated capacity of the cell, $Q_T$.

As, interest in Lithium Sulfur batteries has increased due to its favourable energy density and low cost materials to lighten the load of portable devices and extend the range of electric vehicles. Lithium Sulfur batteries are typically manufactured in variable pouch cell format with lightweight components that offer superior theoretical energy density to the current state of the art for mobile electric devices and electric vehicles. Therefore it is desirable to provide methods and apparatuses for reliably determining state of charge and state of health of a secondary cell such as a Lithium Sulfur cell that is susceptible to the memory effect of a change in capacity due to dynamic cycling of the cell in normal use.

It is in the above context that the present invention has been devised.

Thus, viewed from a first aspect the invention provides apparatus for modelling a state of charge, SOC, of a secondary electrochemical cell in which capacity can be lost due to active reactant species becoming inactive in use, comprising: a cell model module operable to predict the electrical characteristics of the cell in use based on a model representative of the internal state of the cell that correlates a terminal voltage of the cell to an operational condition of the cell for all states of charge, SOC; a memory effect module operable to model the usable capacity of the cell in use based on a memory model representative of the variation in amount of active reactant species in the cell that correlates the proportion of the rated capacity of the cell, $Q_t$, that is usable capacity, $Q_{usable}$, during use based on an operational history of the cell; wherein the apparatus is configured such that the cell model module and/or memory effect module adjusts the cell model module in use based on an operational history of the cell to compensate for the prediction of the usable capacity of the cell by the memory effect module.

In accordance with this aspect of the invention, the provision of a memory effect module that models the usable active capacity of the cell based on its recent operational history, and which can be used to adjust the cell model module accordingly, results in an apparatus for modelling a state of charge of a cell that can compensate for the change in capacity of the cell due to active species being rendered temporarily and/or permanently inactive in use due to dynamic cycling. Thus a reliable model of the internal state of the cell can be produced that can account for the cell's operational behaviour in wide operational range in real world use cases.

The electrochemical cell may have a Lithium Sulfur chemistry. Alternatively the modelled cell may have another chemistry that suffers from the so-called memory effect by which capacity can be lost due to active reactant species becoming inactive in use.

Optionally, the operational condition of the cell includes one or more of: a terminal voltage of the cell; a deemed open circuit voltage of the cell; a current load on the cell; a temperature of the cell; an internal resistance of the cell.

Optionally, the model representative of the internal state of the cell is an equivalent circuit network model comprising a number of modelled electrical elements, the equivalent circuit network model being parameterised by the properties of the constituent electrical elements of the equivalent circuit network model. The equivalent circuit network model may consist of a voltage source, in series with an ohmic resistance and one or more diffuse resistances represented as RC pairs. Optionally, the equivalent circuit network models the cell behaviour by a deemed open circuit voltage of the cell being taken as the voltage source, and the parameterised properties of the ohmic and diffuse resistances being selected to drop the voltage in the circuit down to the terminal voltage of the cell under a given current load and temperature, at a given state of charge. An equivalent circuit network (ECN) is a particularly effective model that is capable of being parameterised to model the behaviour of the cell in use.

Instead of an ECN, other models may be used. Optionally, the model representative of the internal state of the cell is a parameterised physics-based cell model.

Optionally, the apparatus further comprises a parameter value resource configured to be usable to provide to the cell model module values for the parameters of the cell model for the modelled behaviour of the cell at the given operational conditions. Optionally, the parameter values for the cell model are dependent on the modelled state of charge of the cell. Optionally, the parameter values for the cell model are derived empirically or semi-empirically based on tests of standard cells. Optionally, the parameter values for the cell model are stored in a parameter value resource, optionally a lookup table.

Optionally, the memory model representative of the variation in amount of active reactant species in the cell tracks an amount of active reactant in the cell and/or an amount of temporarily inactive reactant in the cell and optionally an amount of permanently inactive reactant in the cell. Optionally, the memory model representative of the variation in the amount of active reactant species in the cell comprises a set of rules relating the different manifestations of the reactant species of the cell, the amounts of the reactant species in those different manifestations, the reactions in which those different manifestations of reactant species participate during charge and discharge, and the reaction rates thereof. Optionally, the modelled reaction rates are parameterised by one or more of: the operating conditions of the cell; the modelled amounts of the different manifestations of reactant species; the internal state of the cell; the electrical characteristics of the cell in use. Optionally, the parameterised values for the modelled reaction rates are derived by theoretical predictions for the cell, or fitted or derived empirically or semi-empirically based on tests of standard cells.

Optionally, the memory model representative of the variation in the amount of active reactant species in the cell is a simplified physical model that groups the reactant species of the cell into three groups representing high order manifestations, medium order manifestations and low order manifestations, and wherein the model divides the charge and discharge curves of the cell into a high plateau and low plateau and assumes that reactions between the high-tomedium order manifestations dominate the high plateau and reactions between the medium-to-low order manifestations dominate the low plateau. Optionally, the memory model assumes that, when the cell terminal voltage falls below a boundary level between the high and low plateaus, the reactions between the high-to-medium order manifestation do not occur, leading to a remaining amount of high order manifestations of reactant becoming deemed temporarily inactive and unable to contribute to the remaining capacity of the cell. Such a simplified physical model may in certain circumstances adequately account for the variation in capacity of cells during dynamic use.

Optionally, the memory effect module is configured to model the usable capacity of the cell, $Q_{usable}$, for a given set of operating conditions, based on the amount of active reactant species in the cell given the cell's history modelled by the memory model.

Optionally, the apparatus is configured to adjust the cell model module in use based on a prediction of the usable capacity of the cell by the memory effect module by adjusting the parameter value resource to provide parameter values to compensate for the loss in usable capacity of the cell. Optionally, the parameter value resource is configured to use the parameter values for the cell model corresponding to a given low current charge or discharge rate as a baseline parameter set, and wherein the apparatus is configured to adjust the parameter value resource such that when the terminal voltage drops below the boundary voltage, the parameter value resource skips the baseline parameter values to continue from the same ohmic resistance value corresponding to the same terminal voltage at the low plateau, wherein the skipped capacity represents the capacity loss due to temporarily inactive species.

Viewed from a second aspect, the present invention provides apparatus for estimating a state of charge, SOC, of a secondary electrochemical cell in use in which capacity can be lost due to active reactant species becoming inactive in use, comprising: a cell operational condition monitor module configured to receive measurements of the operational conditions of the cell in use; a cell model module operable to predict the electrical characteristics of the cell in use based on a model representative of the internal state of the cell that correlates a terminal voltage of the cell to an operational condition of the cell for all states of charge, SOC; a memory effect module operable to model the usable capacity of the cell in use based on a memory model representative of the variation in amount of active reactant species in the cell that correlates the proportion of the rated capacity of the cell, $Q_t$, that is usable capacity, $Q_{usable}$, during use based on an operational history of the cell; wherein the apparatus is configured such that the cell model module and/or memory effect module adjusts the cell model module in use based on an operational history of the cell to compensate for the prediction of the usable capacity of the cell by the memory effect module; a state estimator module configured to operate the cell model module and the memory effect module based on the measurements of the operational conditions of the cell received during use by the cell operation condition monitor module to estimate an internal state of the cell in use; and a state of charge estimator module configured to operate the cell model module based on the estimated internal state of the cell to estimate a state of charge of the cell.

In accordance with this aspect of the invention, the apparatus for modelling the state of charge of the cell can be applied to reliably estimate the state of charge of a cell in use, in which the estimation of the internal state of the cell by the cell model module is adjusted to compensate for the memory effect of capacity variation due to dynamic cycling of the cell as a result of the memory effect module tracking the usable capacity of the cell based on its recent operational history.

The electrochemical cell may have a Lithium Sulfur chemistry. Alternatively the modelled cell may have another chemistry that suffers from the so-called memory effect by which capacity can be lost due to active reactant species becoming inactive in use.

Optionally, the state of charge estimator module is further configured to provide an estimate of the state of health of the cell as a ratio of the modelled usable capacity of the cell, $Q_{usable}$, to the rated capacity of the cell, $Q_t$.

Optionally, the state estimator module is configured to refine the estimated state at each time interval by operating as an iterative feedback loop in which a prediction of the internal state of the cell based on the cell model projecting forward the estimated internal state of the cell at the previous time interval to the current time interval is corrected based on the measured operational conditions of the cell to update the estimate of the current internal state of the cell. Optionally, the state estimator module is configured as a kalman-type filter, optionally as a kalman filter, an extended kalman filter, an unscented kalman filter, a particle filter or a Luenberger state estimator. Optionally, the state estimator module is configured to operate a prediction error minimisation technique to identify estimates of the parameters of the cell model representative of the internal state of the cell in use. Optionally, the state estimator module is configured to solve a set of fuzzy logic rules to identify estimates of the parameters of the cell model representative of the internal state of the cell in use. Use of Kalman-type filters may be particularly effective at giving a smooth an accurate estimation of the state of charge of the cell, that is improved by a correction-estimation loop providing feedback, and which may avoid the need for look up tables storing empirically- or theoretically-derived parameter values entirely.

Optionally, the measurements of the operational conditions of the cell received by the cell operational condition monitor module in use includes: a terminal voltage of the cell; a current load on the cell; and optionally a temperature of the cell; and optionally an internal resistance of the cell.

Optionally, the cell model module and the memory effect module are provided by an apparatus in accordance with any of the above-statements in accordance with the first aspect of the invention.

Optionally, the apparatus further comprises cell operational condition measurement means including: a terminal voltage sensing circuit; and a current load sensing circuit; and optionally: a cell internal resistance sensing circuit comprising a switching circuit including a balancing resistor; and a temperature sensor.

Optionally, the apparatus further comprises one or more processors and computer readable medium storing instructions, which when executed by one or more processors, cause the processor or processors to implement the apparatus in accordance with any of the above statements of the invention.

Optionally, the parameter values for the cell model representing the internal state of the cell are identified in use of the model or in empirical derivation of the parameter values from test cell data, by prediction error minimisation technique. Optionally, the prediction error minimisation technique defines a scalar fitness function.

Viewed from a third aspect, the present invention provides a battery management system comprising plural cells or energy system controller for coupling to plural cells, comprising: apparatus in accordance with any of the above statements of the invention arranged to estimate the state of charge, SOC, and optionally State of Health, SoH, of the said plural cells in use. Use of the apparatuses for modelling or estimating the state of charge of a cell find particular utility in battery management systems and energy system controllers for providing an output indication of a remaining charge or capacity in plural cells providing a battery pack.

Viewed from a fourth aspect, the present invention provides apparatus for estimating a range of an electric vehicle comprising a plurality of secondary electrochemical cells arranged to power the vehicle in which capacity can be lost due to active reactant species becoming inactive in use, the apparatus comprising: apparatus in accordance with any of the above statements in accordance with the second or third aspects of the invention configured to operate to estimate a state of charge and a remaining capacity of the cells in use; and a range estimation module configured to estimate a range of the electric vehicle based the estimation of the state of charge and a remaining capacity of the cells in use and the predicted operational conditions of the cells in use in the vehicle. In accordance with this aspect, use of the apparatus for estimating a state of charge of a cell allows reliable estimation of a range of an electric vehicle.

Viewed from a fifth aspect, the present invention provides apparatus for planning a route for an electric vehicle comprising a plurality of secondary electrochemical cells arranged to power the vehicle in which capacity can be lost due to active reactant species becoming inactive in use, comprising, apparatus for estimating a range of an electric vehicle in accordance with the above statement of the fourth aspect of the invention; and a route planning module configured to plan a route towards a desired destination based at least in part on an estimated range of the electric vehicle produced by the range estimation module based on the predicted operational conditions of the cells following that route. In accordance with this aspect, the use of the reliable range estimation for electric vehicles can facilitate route planning.

Optionally, the apparatus further comprises a route optimisation module for selecting an optimal route towards a destination from plural routes planned by the route planning module.

Viewed from a sixth aspect, the present invention provides computer readable medium comprising instructions which when executed by one or more processors, cause the processor or processors to implement the apparatus in accordance with any of the above statements of the invention.

Viewed from a seventh aspect, the present invention provides a method for generating a model of a secondary electrochemical cell in which capacity can be lost due to active reactant species becoming inactive in use, the model being operable to predict the electrical characteristics of the cell in use based on a model representative of the internal state of the cell that correlates a terminal voltage of the cell to an operational condition of the cell for all states of charge, SOC, wherein the model representative of the internal state of the cell is an equivalent circuit network model comprising a number of modelled electrical elements, the equivalent circuit network model being parameterised by the properties of the constituent electrical elements of the equivalent circuit network model, the method comprising: generating data representative of the behaviour of the cell in use across the range of operational conditions of the cell for all states of charge, SOC; identifying, based on the generated data representative of the behaviour of the cell in use, the parameters of the equivalent circuit model as a function of the State of Charge that cause the equivalent circuit to have electrical characteristics that produce a behaviour of the equivalent circuit model that correspond to the generated data representative of the behaviour of the cell in use While the above-described aspect of the invention sets out the method in relation to the use of an ECN model for the cell, it is to be understood that this is not limiting, and is not an essential feature of the invention. Alternative cell models can be used, including physics-based cell models and high fidelity models that can be parameterised and used to model the behaviour of the cell in use, as with the ECN models.

The electrochemical cell may have a Lithium Sulfur chemistry. Alternatively the modelled cell may have another chemistry that suffers from the so-called memory effect by which capacity can be lost due to active reactant species becoming inactive in use.

Optionally, the equivalent circuit network model consists of a voltage source in series with an ohmic resistance and one or more diffuse resistances represented as RC pairs, wherein the voltage of the voltage source, and the resistances and capacitances of the ohmic resistance and RC pairs parameterise the equivalent circuit model.

Optionally, the operational condition of the cell includes one or more of: a terminal voltage of the cell; a deemed open circuit voltage of the cell; a current load on the cell; a temperature of the cell; an internal resistance of the cell.

Optionally, generating data representative of the behaviour of the cell in use across the range of operational conditions of the cell for all states of charge, SOC, includes predicting a terminal voltage behaviour of the cell at different states of charge of the cell for different operating conditions using a high fidelity physical model of the cell.

Optionally, generating data representative of the behaviour of the cell in use across the range of operational conditions of the cell for all states of charge, SOC, includes: controlled testing the behaviour of standard cells of the design of the modelled cell under a range of different working conditions including: receiving measurements of the cell's terminal voltage at different charge/discharge rates and temperatures and states of charge; and optionally receiving measurements of the cell's internal resistance at different charge/discharge rates and temperatures and states of charge. Optionally, controlled testing the behaviour of standard cells of the design of the modelled cell under a range of different working conditions includes: applying current pulses to the cell at set discharge rates and leaving a relaxation time between the said pulses sufficient to allow the cell's terminal voltage to revert to an open circuit voltage. Optionally, controlled testing the behaviour of standard cells of the design of the modelled cell further includes: starting from a deemed full state of charge of the test cell and proceeding to apply the current discharge pulses until the cell's terminal voltage drops below a pre-determined level used to calibrate a full state of discharge for the test cell. Optionally, generating data representative of the behaviour of the cell in use further includes: taking the cell's terminal voltage at the end of the relaxation phase between each pulse to be the open circuit voltage of the cell at that state of charge. Optionally, identifying the parameters of the equivalent circuit model as a function of the State of Charge comprises: using the cell's open circuit voltage at that state of charge to identify the parameter value for the voltage source of the equivalent circuit network model at that state of charge. Optionally, identifying the parameters of the equivalent circuit model as a function of the State of Charge comprises: using the instantaneous drop in the cell's terminal voltage at the start of a current pulse to identify the parameter value for the ohmic resistance component of the equivalent circuit network model at that state of charge. Optionally, identifying the parameters of the equivalent circuit model as a function of the State of Charge comprises: using the gradual drop in cell's terminal voltage continuing from the instantaneous voltage drop to identify parameter values of the resistances and capacitances of the RC pairs for that state of charge contributing to the diffusion resistance component of the equivalent circuit network model.

Optionally, the method further comprises using a prediction error minimisation technique to refine the parameter values of the cell model representative of the internal state of the cell in use identified based on the generated data representative of the behaviour of the cell in use.

Optionally, the method further comprises storing in a parameter value resource the identified parameter values for the equivalent circuit network model for modelling the behaviour of the cell at all States of Charge across the range of operational conditions of the cell, wherein the parameter value resource is optionally a lookup table.

Optionally, the method further comprises fitting the identified parameter values for the cell model to functions dependent on the state of charge. Optionally, the parameter values are stored in a parameter value resource as a function of state of charge.

Viewed from an eighth aspect, the present invention provides a method of generating a memory model of a secondary electrochemical cell in which capacity can be lost due to active reactant species becoming inactive in use, the model being operable to predict, the memory model being operable to track, in use, an amount of active reactant in the cell and/or an amount of temporarily inactive reactant in the cell and optionally an amount of permanently inactive reactant in the cell, the method comprising: establishing a set of rules relating the different manifestations of the reactant species of the cell, the amounts of the reactant species in those different manifestations, the reactions in which those different manifestations of reactant species participate during charge and discharge, and the reaction rates thereof; parameterising the modelled reaction rates by one or more of: the operating conditions of the cell; the modelled amounts of the different manifestations of reactant species; the internal state of the cell; the electrical characteristics of the cell in use; and identifying the parameterised values for the modelled reaction rates by: theoretical predictions for the cell based on a high fidelity physical model; or fitting or deriving the parameter values empirically or semi-empirically based on tests of standard cells.

Optionally, the memory model representative of the variation in the amount of active reactant species in the cell is a simplified physical model that groups the reactant species of the cell into three groups representing high order manifestations, medium order manifestations and low order manifestations, and wherein the model divides the charge and discharge curves of the cell into a high plateau and low plateau and assumes that reactions between the high-to-medium order manifestations dominate the high plateau and reactions between the medium-to-low order manifestations dominate the low plateau. Optionally, the memory model assumes that, when the cell terminal voltage falls below a boundary level between the high and low plateaus, the reactions between the high-to-medium order manifestation do not occur, leading to a remaining amount of high order manifestations of reactant becoming deemed temporarily inactive and unable to contribute to the remaining capacity of the cell.

Viewed from a ninth aspect, the present invention provides a method for estimating a state of charge, SOC, of a secondary cell in use in which capacity can be lost due to active reactant species becoming inactive in use, comprising: receiving measurements of the operational conditions of the cell in use; estimating an internal state of the cell in use, by: modelling the cell using a cell model module that estimates the electrical characteristics of the cell in use based on a model representative of the internal state of the cell that correlates a terminal voltage of the cell to an operational condition of the cell for all states of charge, SOC; predicting the usable capacity of the cell in use based on a memory model representative of the variation in amount of active reactant species in the cell that correlates the proportion of the rated capacity of the cell, $Q_r$, that is usable capacity, $Q_{usable}$, during use based on an operational history of the cell; adjusting the cell model module in use based on an operational history of the cell to compensate for the prediction of the usable capacity of the cell by the memory effect module; and estimating the internal state configuration of the cell model that fits the received measurements of the operational conditions of the cell; and estimating, based on the modelled internal state configuration of the cell, the State of Charge, SOC, of the cell.

Optionally, the method further comprises: estimating the state of health of the cell as a ratio of the modelled usable capacity of the cell, $Q_{usable}$, to the rated capacity of the cell, $Q_r$.

Optionally, the method further comprises: refining the estimated internal state of the cell at each time interval by operating as an iterative feedback loop in which a prediction of the internal state of the cell based on the cell model projecting forward the estimated internal state of the cell at the previous time interval to the current time interval is corrected based on the measured operational conditions of the cell to update the estimate of the current internal state of the cell.

Optionally, the method further comprises: using a kalman-type filter, optionally a kalman filter, an extended kalman filter, an unscented kalman filter, a particle filter or a Luenberger state estimator to estimate the internal state of the cell at each time interval.

Optionally, the method further comprises: using a prediction error minimisation technique to identify estimates of the parameters of the cell model representative of the internal state of the cell in use.

Optionally, the method further comprises: solving a set of fuzzy logic rules to identify estimates of the parameters of the cell model representative of the internal state of the cell in use.

Optionally, the measurements of the operational conditions of the cell received by the cell operational condition monitor module in use include: a terminal voltage of the cell; a current load on the cell; and optionally a temperature of the cell; and optionally an internal resistance of the cell.

Optionally, the method is operating in a battery management system comprising plural cells or energy system controller for coupling to plural cells.

Viewed from a tenth aspect the present invention provides a method for estimating a range of an electric vehicle comprising a plurality of secondary electrochemical cells arranged to power the vehicle in which capacity can be lost due to active reactant species becoming inactive in use, the method comprising: performing a method in accordance with the above statement of the ninth aspect of the invention of estimate a state of charge and a remaining capacity of the cells in use; estimating a range of the electric vehicle based the estimation of the state of charge and a remaining capacity of the cells in use and the predicted operational conditions of the cells in use in the vehicle.

Viewed from an eleventh aspect the present invention provides a method for planning a route for an electric vehicle comprising a plurality of secondary electrochemical cells arranged to power the vehicle in which capacity can be lost due to active reactant species becoming inactive in use, comprising, performing a method in accordance with the above statement of the tenth aspect of the invention to estimate a range of an electric vehicle; and planning a route towards a desired destination based at least in part on an estimated range of the electric vehicle produced by the range estimation module based on the predicted operational conditions of the cells following that route. Optionally, the method further comprises selecting an optimal route towards a destination from plural routes planned by the route planning module.

BRIEF DESCRIPTION OF THE DRAWINGS

Certain preferred embodiments of aspects of the invention will now be described, by way of example only, and with reference to the accompanying drawings, in which.

DESCRIPTION OF THE EMBODIMENTS

While the following description sets out the embodiments of the invention specifically in relation to Lithium Sulfur cells, it is to be understood that the invention also finds utility with other cell chemistries, particularly those in which the usable capacity of the cell can vary in use due to active species being rendered temporarily inactive through to dynamic loads and cycling (i.e. variable current during a cycle, varying temperature, and varying depths of charge and discharge). As Lithium Sulfur cells exhibit this memory effect, the present invention is particularly useful for reliably modelling and estimating the state of charge and state of health of Lithium Sulfur cells in normal use conditions.

Figure 1:
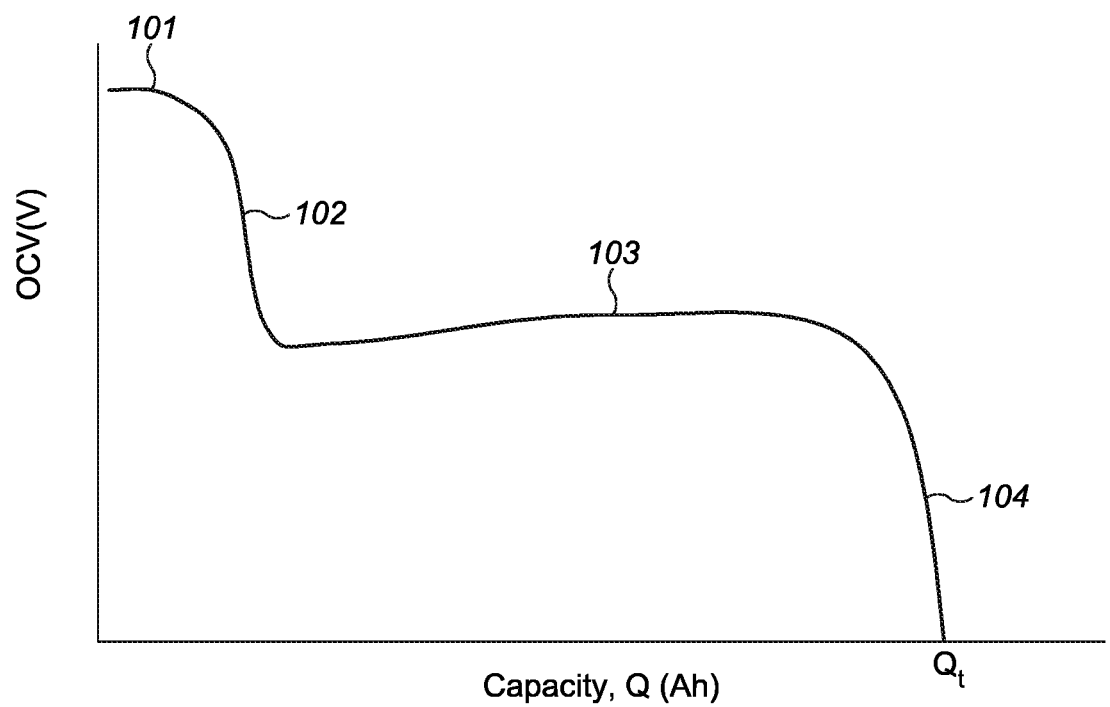
FIG. 1 is an illustrative discharge curve for an example Lithium Sulfur cell plotting OCV against state of charge.
Figure 2:
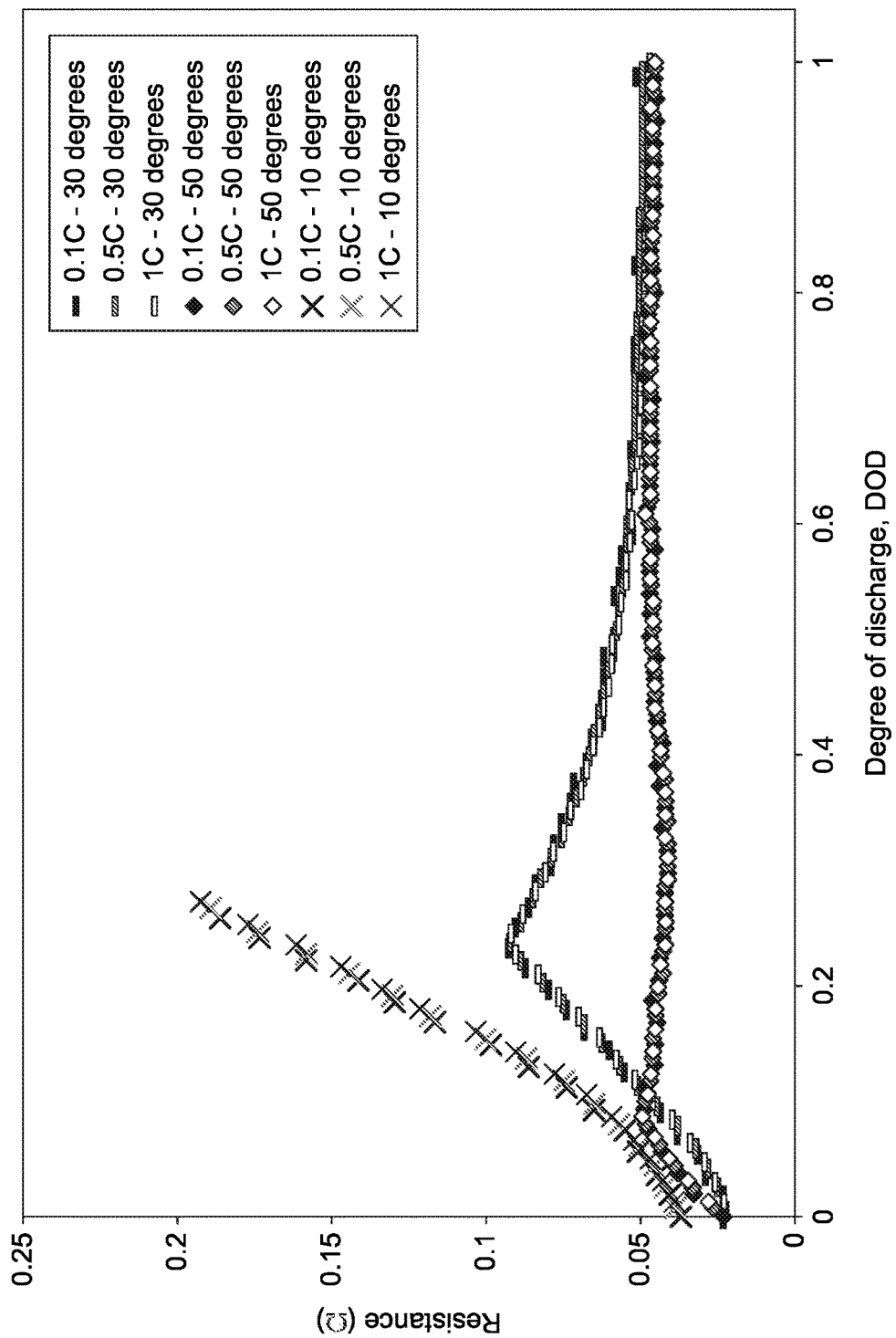
FIG. 2 is a graph illustrating the gradual change the ohmic resistance of an example Lithium Sulfur cell against degree of discharge (i.e. 1-SOC) as a function of discharge rate and temperature.

In contrast to other common battery systems the active material in a Lithium Sulfur cell dissolves from the cathode into the electrolyte during discharge where it undergoes complex inter-conversion to multiple intermediate species of varying electrochemical activity and stability, the process is reversed on charge. As shown in FIG. 2, the change in electrolyte composition causes a gradual change in resistance which can be used to indicate SOC in a steady state and calibrated system as described in the published U.S. Pat. No. 7,688,075 B2. However, the reversible dissolution of intermediate species is not 100% efficient and the concentration of intermediate species remaining in the electrolyte at the end of charge or discharge varies with charge/discharge rate, temperature and depth of discharge or charge (before the next charging/discharging cycle is begun). It is these species that give rise to the variable internal resistance, and therefore internal resistance alone is not necessarily a reliable predictor of SOC for Lithium Sulfur cells.

For any charge or discharge the maximum usable capacity $Q_t$ for that cycle (i.e. $Q_{usable}$) is composed of the conversion of Sulfur available in the cathode to Lithium sulphide plus the change in concentration of intermediate species in the electrolyte taking part in electrochemical reactions. The change in concentration of intermediate species in the electrolyte can be both positive and negative and is affected by other factors such as cell materials, diffusion rates and active material degradation rates, thus the relative state of charge depends upon the cumulative history of previous cycles. Lithium Sulfur cells experience a memory effect under dynamic loads. In a real life dynamic system which can experience rapidly varying temperature, discharge rate and charge rate as well as variable depths of charge and discharge, pre-calibration of the SOC estimator alone cannot give a good estimate of $Q_t$ at the '100% SOC/SOD' condition relative to the cell resistance because the '100% SOC/SOD' state depends on the actual environmental and operational conditions the cell has experienced during use, which in turn dictates the level of intermediate species dissolved in the electrolyte.

In order to achieve this the present invention provides apparatus for modelling and estimating the SOC and SOH of the cell that is "memory effect aware". The model uses the unique environmental history of a cell or battery in order to identify the current state of that cell or battery based on model predictions.

Overlaid over the cycle to cycle SOC memory effect are time and cycle number derived degradation processes that irreversibly reduce the amount of active sulfur species available for reaction and or degrade the cell materials to reduce the utilisation of active sulfur available. SOH is accounted for by reducing the available active materials as a function of time and cycle number derived from experiment.

In order to determine the state of charge and state of health of a Lithium Sulfur battery an apparatus and method for estimating a Lithium Sulfur cell's terminal voltage under different conditions utilising a model and cumulative history data collected for a Lithium Sulfur cell operating under dynamic load is used.

Figure 3:
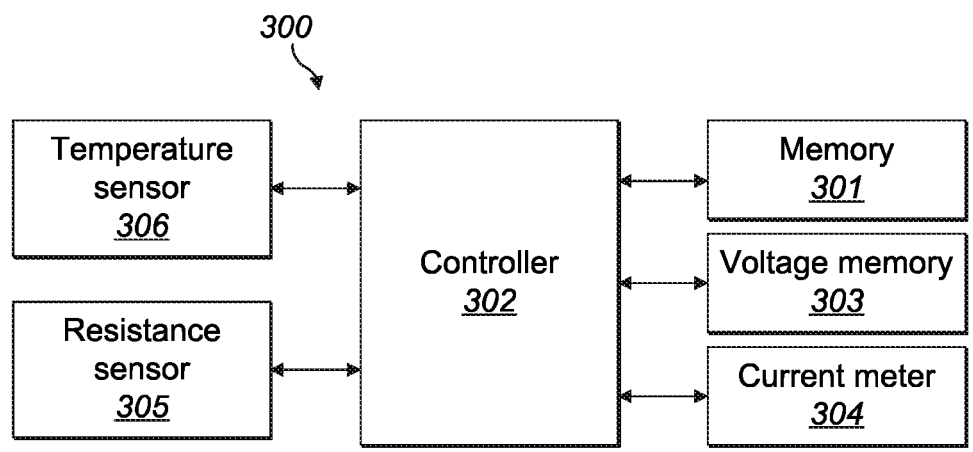
FIG. 3 is a schematic Illustration of an apparatus for estimating an SOC and SOH according to an exemplary embodiment of the present invention.

Referring to FIG. 3, the apparatus 300 for estimating the state of health of a cell includes a memory 301 to store the cumulative operating conditions that a cell in use has been exposed to, made available to the controller 302. The apparatus 300 is coupled to Lithium Sulfur cell (not shown) in use and is configured to estimate the SOC and SOH thereof. In this embodiment, the apparatus further comprises the cell operational condition measurement means including: a terminal voltage sensing circuit 303; and a current load sensing circuit 304; a cell internal resistance sensing circuit 305 comprising a switching circuit including a balancing resistor; and a temperature sensor 306. These are arranged to measure or calculate and input to the controller 302 the current load on the cell, the terminal voltage on the cell, a measure of the internal resistance of the cell and the temperature of the cell and/or the ambient temperature.

Figure 4:
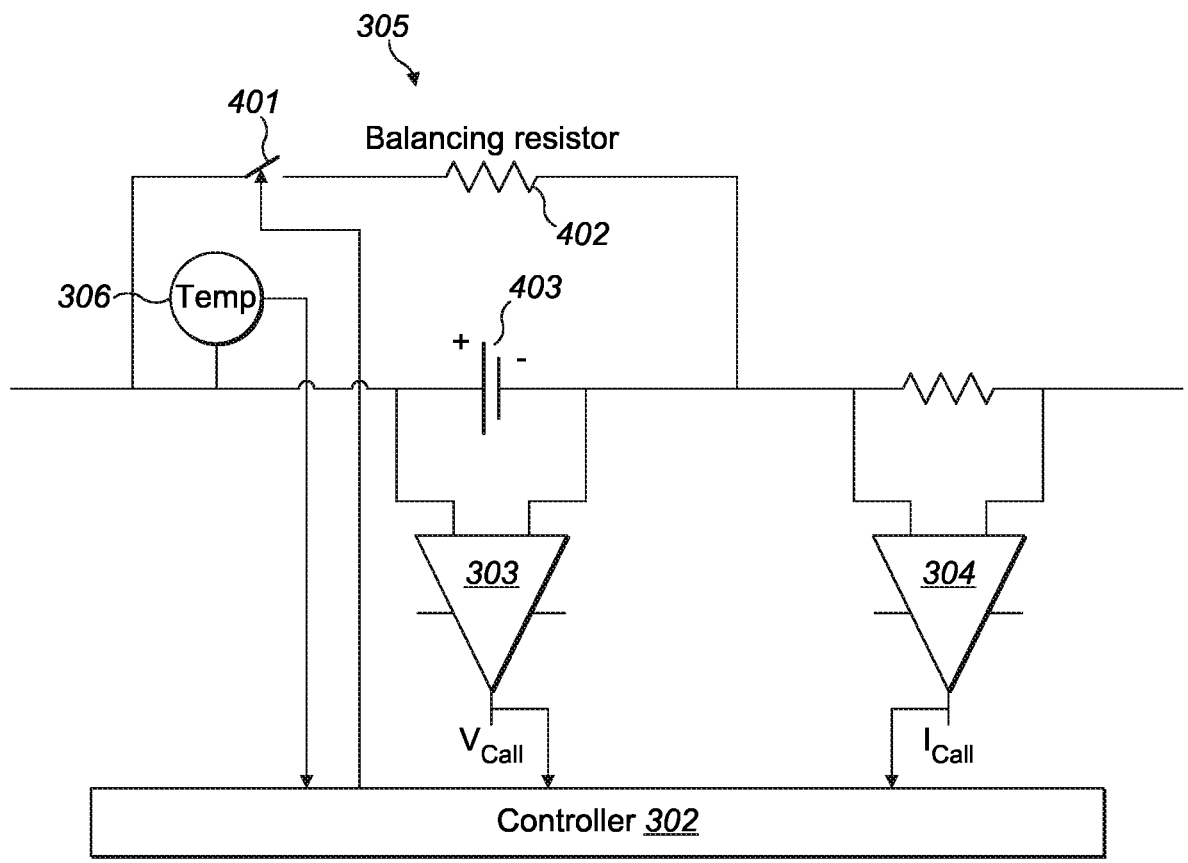
FIG. 4 is a simplified circuit diagram illustrating the cell operational condition measurement means and the operation of the internal resistance sensing circuit.

Referring to FIG. 4, the cell operational condition measurement means 400 is shown in more detail. Here, the cell's internal resistance is periodically measured in real time in use by calculation from a current pulse imposed by switching (using switch 401) a balancing resistor 402 in order to provide the apparatus with direct feedback of the measured internal resistance of the cell 403 in use. In embodiments, the controller 302 may provide an estimate of the internal resistance of the cell in use, based on the estimate of the internal state of the cell. By comparing this with the measurement of the internal resistance obtained using the cell internal resistance sensing circuit 305, the controller's model of the internal state of the cell can be adjusted using positive feedback.

Figure 5:
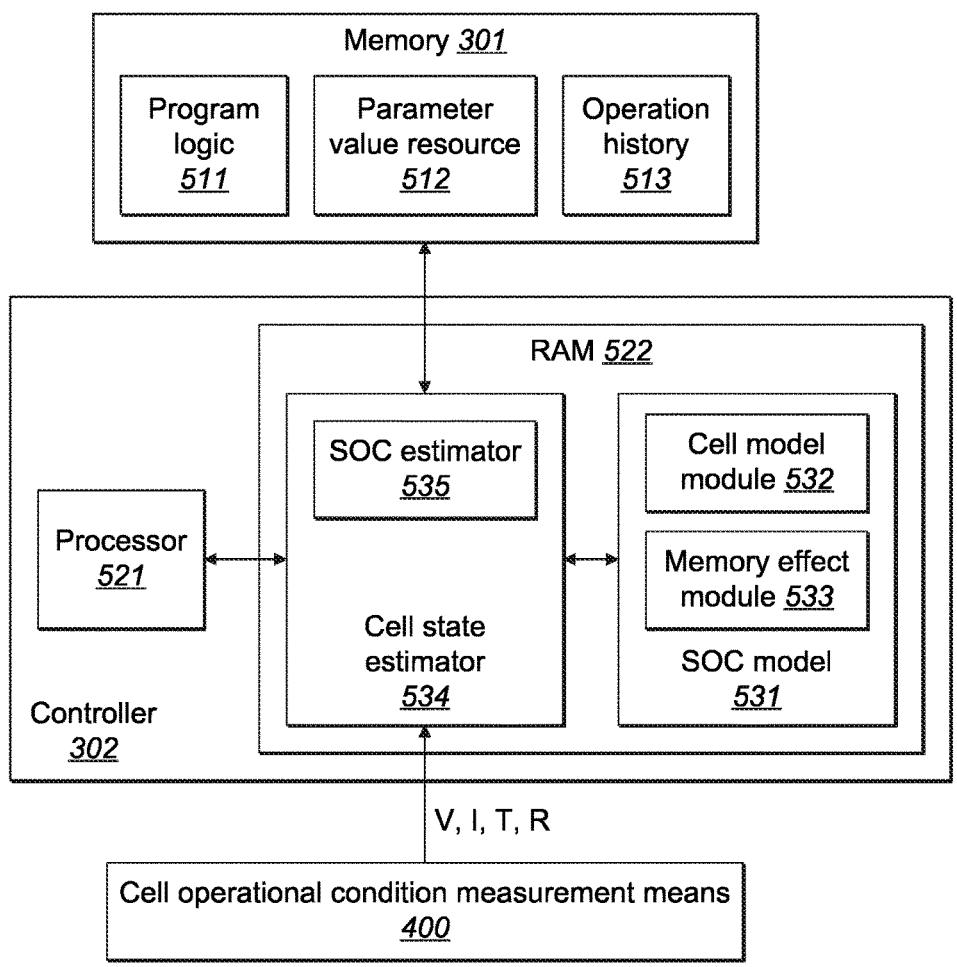
FIG. 5 is a schematic illustration of an apparatus for estimating an SOC and SOH according to an exemplary embodiment of the invention, in which the controller and memory are shown in more detail.

In accordance with aspects of the invention, as shown in FIG. 5, the controller 302 implements an apparatus (i.e. the SOC model 531 in this embodiment) for modelling the state of charge and state of health of a cell (e.g. an LiS cell). Specifically, the Controller 302 comprises processor 521 (which may be provided by one or more processors) for carrying out computer readable instructions, and RAM 522.

The memory 301 stores program logic 511 which when executed by the controller 302 (specifically the processor 521) causes the controller 302 to implement the apparatus for modelling and estimating the SOC/SOH of the cell in accordance with aspects of the invention.

Specifically, the processor 521 instantiates in RAM 522 an SOC model 531 for modelling the state of charge and state of health of the cell 403, by modelling the operational behaviour thereof in its operational range.

This is achieved by the SOC model 531 including a cell model module 532 operable to predict the electrical characteristics of the cell in use based on a model (such as an equivalent circuit network (ECN) or a physics-based cell model) representative of the internal state of the cell that correlates a terminal voltage of the cell to an operational condition of the cell for all states of charge, SOC. The cell model is parameterised, in the example of an ECN model, by the properties of the constituent electrical elements of the equivalent circuit network model. The parameter values for the ECN are provided to the cell model module 532 from a parameter value resource 512 stored in memory 301 configured to be usable to provide to the cell model module values for the parameters of the ECN cell model for the modelled behaviour of the cell at given operational conditions. Thus, for a set of given operational conditions, and an SOC, the parameter values for the ECN can be obtained. To generate the parameter values to create the cell model for the cell 403, the parameter values for the cell model are derived empirically or semi-empirically based on tests of standard cells. The parameter values for the cell model are dependent on the modelled state of charge of the cell. The parameter value resource 512 is optionally a lookup table.

The SOC model 531 also includes a memory effect module operable to model the usable capacity of the cell in use based on a memory model representative of the variation in amount of active reactant species in the cell that correlates the proportion of the rated capacity of the cell, $Q_t$, that is usable capacity, $Q_{usable}$, during use based on an operational history 513 of the cell stored in memory 301. The memory model tracks an amount of active reactant in the cell and/or an amount of temporarily inactive reactant in the cell (representative of the temporary variation of capacity due to dynamic use and loading of the cell) and optionally an amount of permanently inactive reactant in the cell (representative of the permanent loss of capacity of the cell). The memory model comprises a set of rules relating the different manifestations of the reactant species of the cell, the amounts of the reactant species in those different manifestations, the reactions in which those different manifestations of reactant species participate during charge and discharge, and the reaction rates thereof. The modelled reaction rates are parameterised by one or more of: the operating conditions of the cell; the modelled amounts of the different manifestations of reactant species; the internal state of the cell; the electrical characteristics of the cell in use. The parameterised values for the modelled reaction rates are derived by theoretical predictions for the cell, or fitted or derived empirically or semi-empirically based on tests of standard cells.

To account for the memory effect on the variation in capacity of the cell in use, the SOC model 531 is configured to adjust the cell model module 532 in use based on an operational history of the cell to compensate for the prediction of the usable capacity of the cell by the memory effect module. This adjusting may be performed by the cell model module 532 and/or memory effect module 533.

As such, the SOC model 531, once created, can be used to model the internal state and operational behaviour of the cell in its operational range, even taking into account the memory effect.

However, in use, the SOC model 531 can be used to estimate the SOC of the cell in the following way.

The program logic 511 also causes the processor 521 to instantiate in RAM 522 a cell state estimator 534 configured to operate the cell model module 532 and the memory effect module 533 based on the measurements of the operational conditions of the cell received during use by the cell operation condition monitor module 400 to estimate an internal state of the cell in use. Once the cell state estimator 534 has estimated an internal state of the cell 403 using SOC model 531, an SOC Estimator module 535, which may or may not be a subcomponent of the cell state estimator module 534, is configured to operate the cell model module 532 based on the estimated internal state of the cell to estimate a state of charge of the cell. This is achieved by using the estimated parameters for the ECN model to determine the SOC, by reference to the parameter value resource 512.

While the example above indicates a software-driven implementation of components of the invention by a more general-purpose processor 521 such as a CPU core based on program logic stored in a memory 301, in alternative embodiments, certain components of the invention may be partly embedded as pre-configured electronic systems or embedded controllers and circuits embodied as programmable logic devices, using, for example, application-specific integrated circuits (ASICs) or Field-programmable gate arrays (FPGAs), which may be partly configured by embedded software or firmware.

Specific implementations of the apparatus 300 for creating the SOC model 531 and the cell state estimator 534 for modelling and estimating the SOC of a cell will be explained in more detail below. In its various implementations, the present invention provides apparatuses and methods for the precise and accurate determination of the state of charge and state of health of Lithium Sulfur batteries, modules or cells. The apparatus 300 is, in embodiments, provided as part of battery management system comprising plural cells or energy system controller for coupling to plural cells.

Generating the Cell Model Module—Equivalent Circuit Example

Figure 6A:
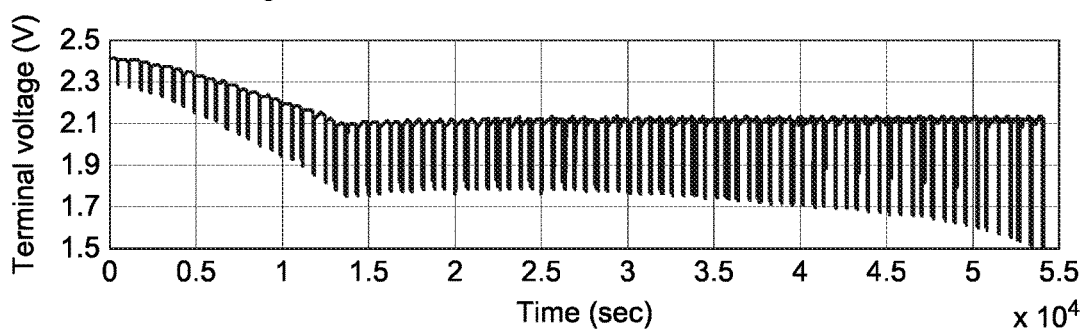
FIG. 6a is a voltage vs time plot and FIG. 6b is a current load vs time plot showing example experimental test results from an ECN model parameterisation experiment using a test LiS cell.
Figure 6B:
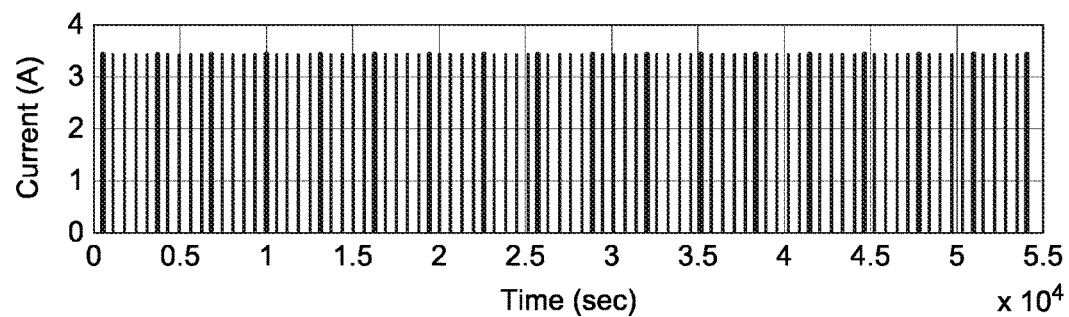

An equivalent circuit model is first generated for the cell which correlates the terminal voltage, V as a function of current and temperature for each SOC of the cell (i.e. 100% to 0%). This is achieved using either standard battery test equipment to generate test data from standard cells of the same type that is subsequently analysed, or predicted using a high fidelity physical model of the LiS cell. The output is used to parameterise the equivalent circuit model, the parameter values being dependent on the SOC. The parameter values and model are embedded into a battery management system or energy system controller comprising plural cells.

Where experimental tests are performed, this is in order to observe the cell's behaviour under different working conditions such as charge or discharge rate (i.e. the ratio of the discharge/charge current compared to the discharge/charge current that would deliver the rated capacity (in a given timeframe) and temperature. Each test data includes time, imposed current, battery terminal voltage and temperature. As shown in FIG. 6b, which shows the current load applied to the cell against time, in a typical test method, consecutive discharge current pulses with constant amplitude are imposed to the cell and the cell's terminal voltage is measured. As can be seen, in the example test, 86 consecutive current discharge pulses having a discharge rate of 1 C were applied, each followed by 600 seconds rest.

As can be seen from FIG. 6a, which shows the terminal voltage of the LiS cell against time, the test cell starts at full charge 2.8-2.1V and continues until the cell's terminal voltage drops below a pre-defined cut off voltage between 0.5 to 2.1V. The sampling rate can vary between 0.1 seconds and 12 hours.

In the gathering of experimental test data, each current pulse is followed by enough relaxation time (1 second to 100 hours) for the battery terminal voltage to return to open circuit voltage $V_{oc}$ and/or a steady state.

Figure 7A:
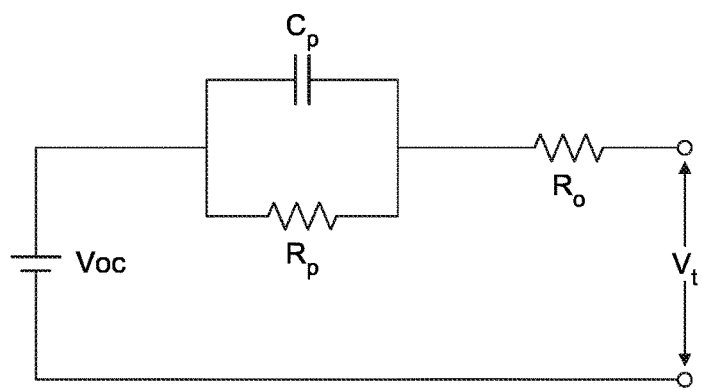
FIGS. 7a and 7b show simple equivalent circuit network models for the behaviour of LiS cells.
Figure 7B:
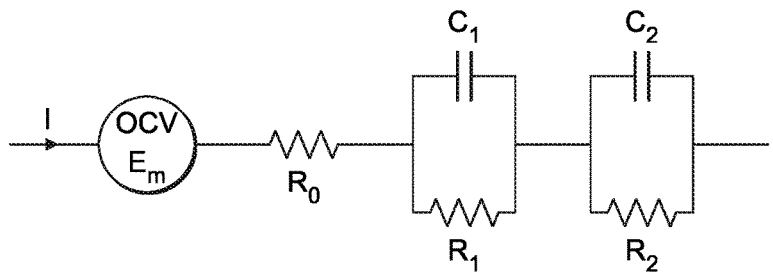

For an equivalent circuit network a model structure is then chosen that provides suitable flexibility to fit the experimental data balancing goodness of fit with computational complexity. An example simple model for the behaviour of an LiS cell is shown in FIG. 7a, in which the terminal voltage $V_t$ is produced by the cell providing its open circuit voltage $V_{ocv}$, in series with an ohmic resistance, $R_o$, and a diffuse resistance provided by one or more RC pair(s) having a resistance, $R_p$ and a capacitance, $C_p$. The equivalent of this shown in FIG. 7b takes the open circuit voltage as a voltage source, in series with the ohmic resistance, $R_o$, and a diffuse resistances provided by RC pairs, $R_n$, $C_n$.

The equivalent circuit network model of the LiS cell is then parameterised by the properties of the constituent electrical elements of the equivalent circuit network model—i.e. the open circuit voltage and the ohmic and diffuse resistances. The parameterisation is performed using, e.g. the observed behaviour in the test data.

One example method of model parameterisation takes the open circuit voltage, $V_{ocv}$ as a potential source whose value is defined by the SOC, which is determined by the current, the defined model input. The number of RC pairs in the model structure can be increased to improve the agreement between the model and the experimental data. The intent of the model is to predict the total voltage drop across the circuit as a function of time, given a particular input current at a specified temperature. This can be calculated provided with open circuit voltage, $R_n$ and $C_n$. As open circuit voltage in a lithium sulfur cell is not a true OCV, which is equal to 2.15V+/−0.1V, for the purposes of the model the cell potential at the end of each relaxation phase, $E_m$, is taken as the OCV.

Figure 8A:
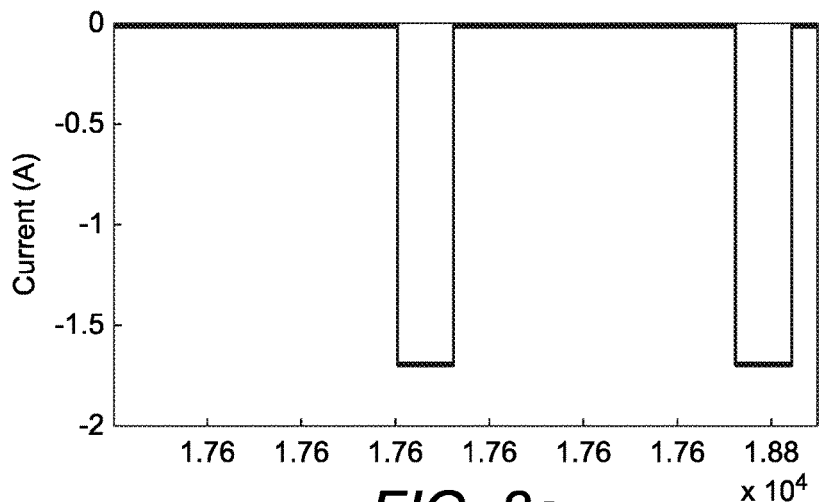
FIGS. 8a and 8b which show a detail, respectively, of the current load against time, and the terminal voltage of the test LiS cell against time, for a current pulse shown in FIG. 6.
Figure 8B:
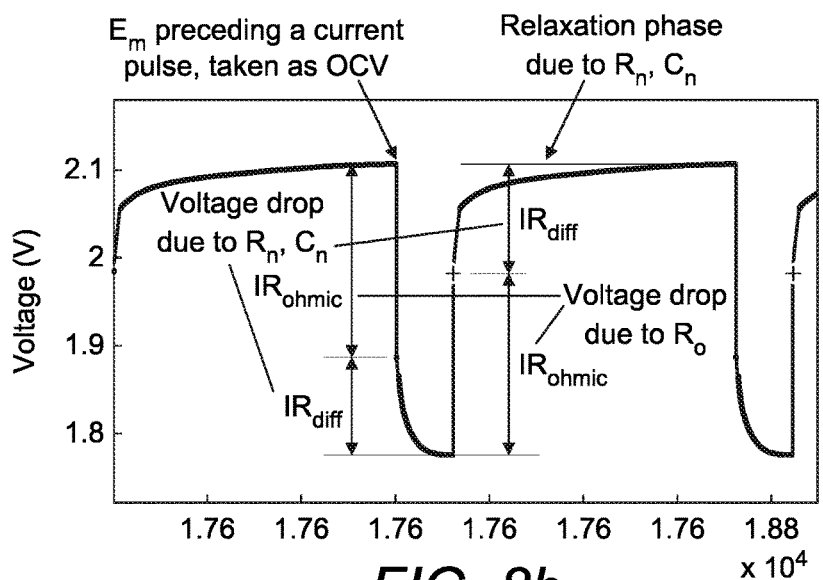

Reference will now be made to FIGS. 8a and 8b, which show a detail, respectively, of the current load against time, and the terminal voltage of the test LiS cell against time, for a current pulse shown in FIG. 6. As shown in FIG. 8b, the series ohmic resistance $R_0$ can be calculated or parameterised directly from the experimental data by measuring the immediate voltage drop on application of, or the immediate voltage rise on release of, a current pulse. The immediate change in voltage is assumed to be as a result of the ohmic resistance component of the equivalent circuit model, and is used to calculate the same.

The remaining $R_n$ and $C_n$ values of the diffuse resistance components that are assumed to cause the delayed resistance leading to the curved change of the cell voltage shown in FIG. 8b are unknown. The following parameterisation process, using the data in the relaxation phase curve after a current pulse has finished, is used to fit the equivalent circuit network model to the output experimental data in order to determine them.

Mathematically, the potential difference across the equivalent circuit network is equal to the open circuit voltage minus the potential drops across $IR_0$ omhic resistance and the RC pair diffuse resistances ($V_1$ and $V_2$ in the case of 2 RC pairs), according to the following relation:

$$V = E_m - IR_0 - V_1 - V_2$$

The potential drop across each of the RC pairs is governed by the relationship:

$$I = \frac{d}{dt}(C_n V_n) + \frac{V_n}{R_n}; n = 1, 2$$

So during pulsing the cell voltage is given by:

$$V = E_m - IR_0 - \sum_n \left\{ IR_n \left[ 1 - \exp\left(-\frac{t}{R_n C_n}\right) \right] + V_n(0)\exp\left(-\frac{t}{R_n C_n}\right) \right\}$$

Where $V_n(0)$ is the initial voltage across the RC pair, assumed to be zero at the start of each pulse. During relaxation the voltage is given by:

$$V = E_m - \sum_n V_n(0)\exp\left(-\frac{t}{R_n C_n}\right)$$

Where $V_n(0) = IR_n$ is the potential at the end of the preceding pulse, which can be calculated assuming that the capacitors are fully charged.

The fitting procedure for the unknown $R_n$, $C_n$ parameters uses a non-linear least squares technique or suitable alternative, minimising the sum over all data points of the square of the error between the model and experiment:

$$S = \sum_i (V_{i,expt} - V_{i,model})^2$$

Where i ranges over all data points in the discharge curve. The value is minimised using the trust-region reflective algorithm or suitable alternative.

Figure 9A:
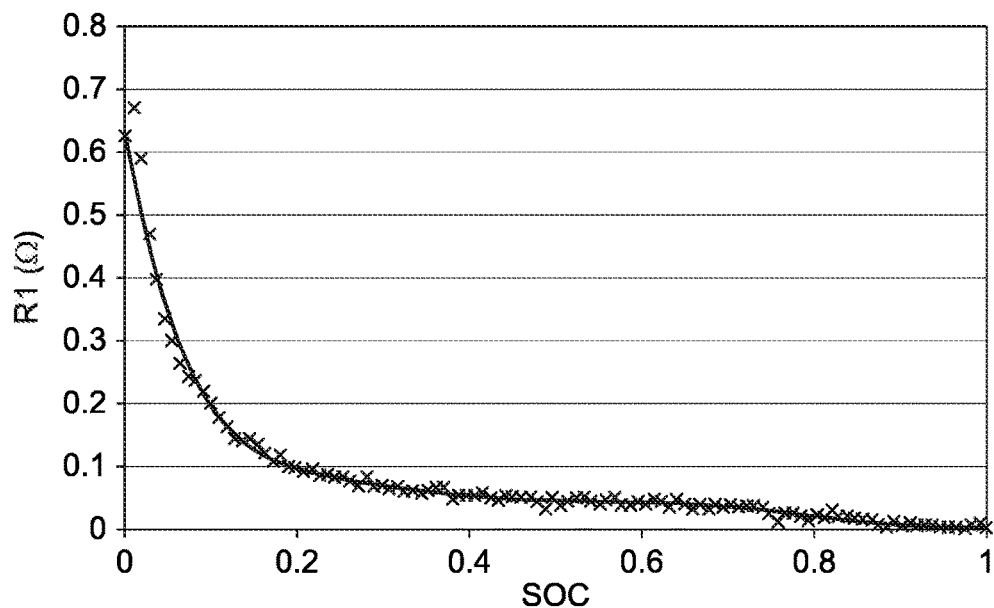
FIGS. 9a and 9b show, respectively, the parameterised values of $R_1$ and $R_2$ as a function of SOC at 10° C. and a current discharge rate of 0.1 C.
Figure 9B:
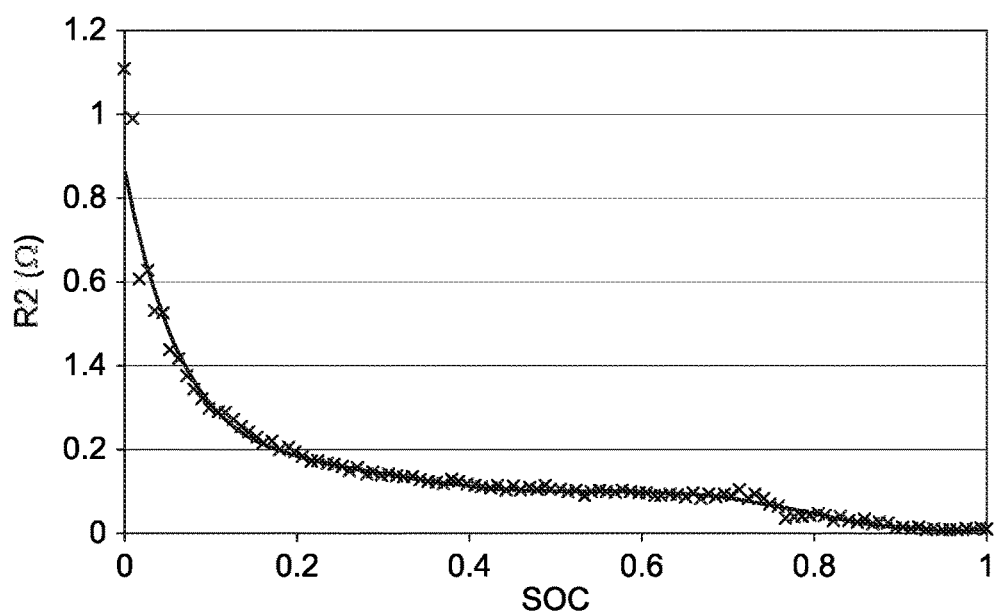

Following estimation of all the parameters for the ECN model using the experimental test data, look up tables are created for each SOC for the RC branch resistances and capacitances, the data is smoothed using best fit curve fitting, as shown in FIGS. 9a and 9b, which show, respectively, the parameterised values of $R_1$ and $R_2$ as a function of SOC at 10° C. and a current discharge rate of 0.1 C. The crosses denote the parameter estimation results and the line is the best fit curve.

The look up tables can be stored as parameter value resource 512 in a working SOC/SOH estimator in accordance with the invention, which are used to create a model of the standard test LiS cell's behaviour, not taking into account any memory loss effect.

Fitted parameters and equations for the curves are generated, for example, in accordance with the following fitted polynomials:

$$R_1 = \sum_{i=0}^{k} a_i SOC^i$$

$$R_2 = \sum_{i=0}^{m} a_i SOC^i$$

$$C_1 = \sum_{i=0}^{l} a_i SOC^i$$

$$C_2 = \sum_{i=0}^{p} a_i SOC^i$$

Figure 10:
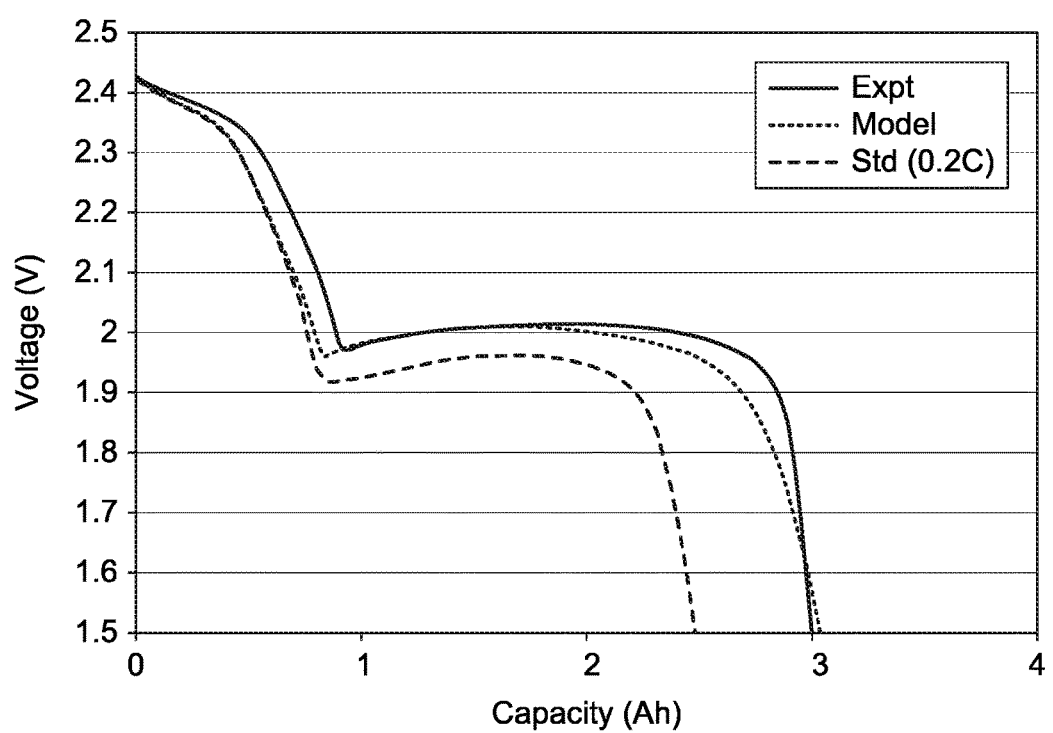
FIG. 10 shows the ECN-predicted and experimental discharge curves for a 0.1 C constant current discharge rate, and standard experimental data for a discharge curve for a 0.2 C constant current discharge rate.

Depending on the form of the curve that is being fitted, two or more polynomials may be used to fit different parts of the curve. This is useful in the event that it is not practical to fit the curves with just a single polynomial, and so a combination of two or more polynomials can be used.

Where look up tables retain the parameters of the equations against SOC. After parameterisation, the experimental and predicted constant current discharge curves can be plotted, as shown in FIG. 10 (which shows the ECN-predicted and experimental discharge curves for a 0.1 C discharge rate, and standard experimental data for a discharge curve for a 0.2 C discharge rate), to validate the model.

For solving model equations, coulomb counting is used to determine the parameter values at a particular solution time step, interpolation is used to determine any necessary intermediate values in lookup tables. The equations are solved to determine the total potential drop at that time.

Generating the Memory Effect Model

Figure 11A:
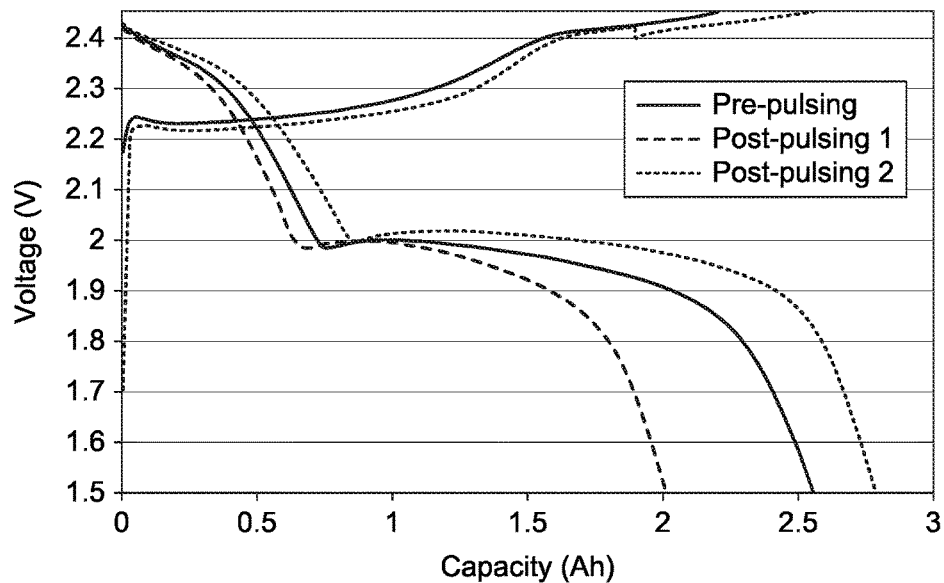
FIG. 11a illustrates the capacity variation of a same cell undergoing dynamic cycling, as shown in FIG. 11b which shows the cell voltage against time for the pre-pulsing, pulsing, and post-pulsing cycles.
Figure 11B:
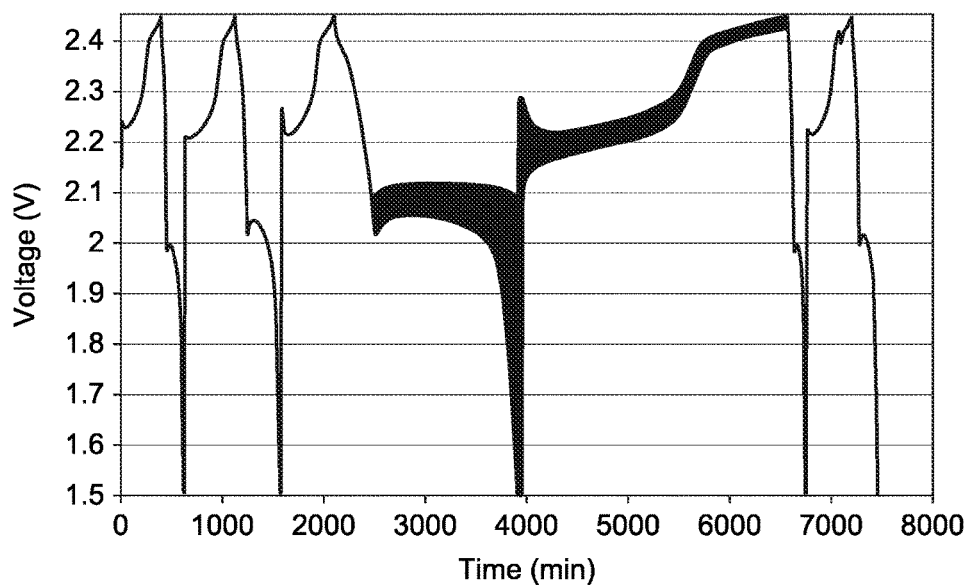

The look up tables generated by the equivalent circuit network model are then modified by a model of the Lithium Sulfur memory effect in order to adjust $Q_t$ based on the prior history of the cell and the likely environmental conditions during a specific cycle. Previous charge/discharge events and their conditions (temperature and current magnitude) affect the concentration of species dissolved in the electrolyte, and can thus lead to marked variations in the instantaneous series resistance of the cell, as can be observed in FIG. 11 where variation of $Q_t$ can be observed, the cell capacity pre-pulsing experiment is Ca 2.5 Ah and on the first cycle post pulsing experiment the capacity reduces to Ca. 2 Ah but on the subsequent cycle the capacity recovers to Ca. 2.8 Ah. In detail, FIG. 11a illustrates the capacity variation of a same cell undergoing dynamic cycling, as shown in FIG. 11b which shows the cell voltage against time for the pre-pulsing, pulsing, and post-pulsing cycles. The same cell cycling at the same temperature and current gives a capacity of 2.5 Ah. It is then subjected to a simulated dynamic discharge and charge. The next two subsequent cycles show first lower capacity of 2 Ah followed by a greater capacity of 2.8 Ah demonstrating reversible capacity variation under dynamic load and that there is a complex response to current variation.

This variation in $Q_t$ following dynamic cycling is a manifestation of the memory effect.

In order to capture this memory effect and its impact on state of charge estimation, a model additional to the equivalent circuit model providing the cell model, but in connection to it is used, this is the memory model which is implemented in the memory effect module 533.

The memory model keeps track of the amount of sulfur material present in different manifestations in the cell: currently active reactants and products, and temporarily inactive species, allowing the temporary variation in the usable capacity of the cell due to the memory effect to be monitored and compensated for when predicting SOC.

The model can also be expanded to include degradation due to loss of active material by including a further manifestation—that of polysulfide material rendered permanently inactive to account for SOH, allowing the permanent reduction in the usable capacity of the cell due to the irretrievable loss of reactant to be monitored and compensated for when predicting SOC.

Thus, the memory model allows the SOC estimation apparatus and method in accordance with the present invention to provide the SOC based on how much active species ($Q_{usable}$) is present and that can still usefully contribute to $Q_t$. State of health is determined by $Q_{usable}/Q_{t=0}$ where $Q_{t=0}$ is the starting capacity of the cell.

The memory model effectively tracks the state of charge of the battery by monitoring the quantity of sulfur in these different manifestations throughout the cell lifetime for any given current load. It is synergistic with an equivalent circuit model, or any type of model that captures the dynamics of precipitation/dissolution, redox reactions and diffusion through electrolyte.

In order to generate and operate the LiS model for a given cell, to begin with, the case of low enough current applied to the LiS cell can be taken as a reference charge/discharge performance, even if unrepresentative for the cell's usage. In this case, the memory model indicates the way in which this reference information is used in predicting/monitoring the state of charge of the cell under any realistic current load.

A set of sulfur species together with the reactions in which they participate is cast into a set of rules (equations) for charge and/or discharge. The reactions can be both electrochemical and chemical. The voltage of the cell is calculated as the equilibrium voltage of all electrochemical reactions taking place concomitantly, as example via Nernst equations for each allowed reaction. The rates at which sulfur material is converted from one manifestation to others is given by the rate of the different reactions, but also by the amount of current passed through, the temperature, and amount of reactant versus amount of product. Reaction rates are predicted, fitted or experimentally derived. Mathematically, this effect can be described by solving the Butler-Volmer equation or similar to extract the contribution of each species to the total ionic current inside the cell. As a result, the instantaneous quantity of material in each manifestation is dependent on the history of the cell, and causes the cell voltage and the series resistance to be dependent upon it.

In one simplified version of the memory model, the active material appears in three possible manifestations: high order, medium order and low order polysulfides. The high-to-medium order reaction dominates the higher operating voltages, giving rise to the high order plateau, while the medium-to-low order reaction determines the low order plateau. During discharge, if high order polysulfides are still present when the cell is at a low plateau voltage, they do not (or are assumed not to) react, thus becoming temporarily inactive.

The series resistance for a low current pulsed discharge is considered to be proportional to the amount of middle order polysulfide dissolved in electrolyte. In the case of this simple memory model, there are only three sulfur manifestations. As a result, in the low plateau the proportion of active material that is a middle order polysulfide dictates the remaining capacity of the cell, whereas in the high plateau it would be both the high and middle order polysulfides.

In view of this simplified memory model, a possible mechanism will now be described for adjusting the operation of the cell model in retrieving parameter values from the parameter value resource 512 (i.e. the lookup tables) to compensate the cell model for the rendering of active species temporarily inactive modelled by the memory model.

As above, the voltage of the cell is obtained in the ECN model as the voltage source ($E_m$, open circuit voltage) minus the voltage drop across the RC components in the circuit. For example:

$$V_{cell} = E_m - IR_0 - \sum_1^n \frac{Q_{C,n}}{C_n}, \text{ where } \frac{dQ_{C,n}}{dt} = I(t) - \frac{Q_{c,n}}{R_n C_n}$$

As a result of this approach, under a current load the cell voltage $V_{cell}$ reaches values corresponding to the low plateau region despite $E_m$ corresponding to a high plateau voltage. The difference between $V_{cell}$ and $E_m$ increases with current load. As soon as $V_{cell}$ reaches a pre-defined boundary, $V_b$ (the boundary voltage between the high and low plateaus), the unreacted high order polysulfide is stored as inactive or dormant, and the middle order polysulfide starts reacting towards low order polysulfide, according to the dominating reaction in the low plateau.

Figure 12A:
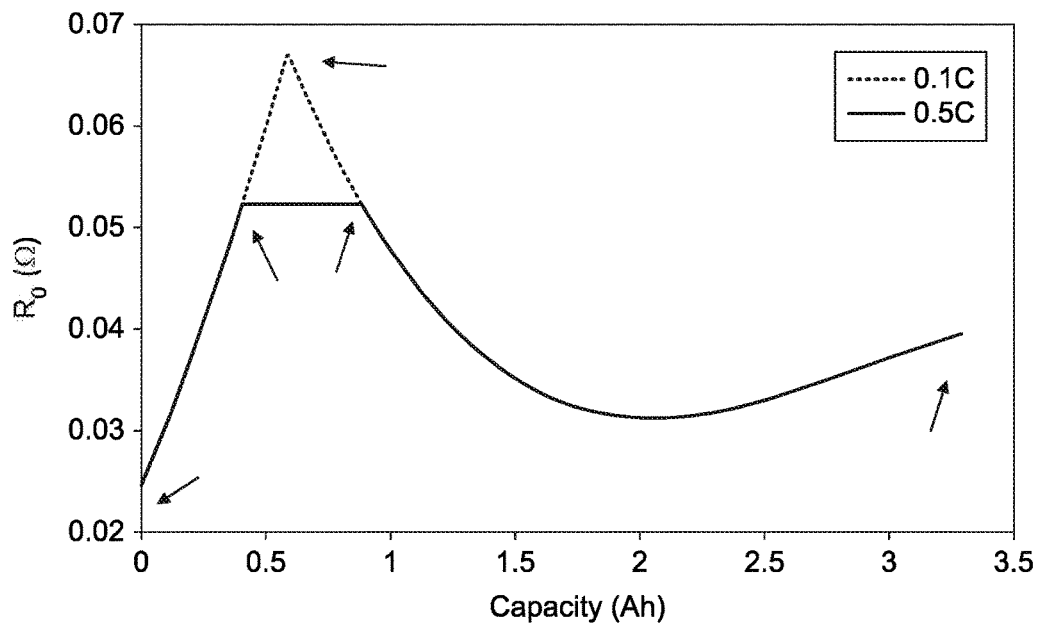
FIG. 12a shows reading the look-up table for $R_o$ as dictated by a simple memory model for a 0.1 C and a 0.5 C discharge rate.
Figure 12B:
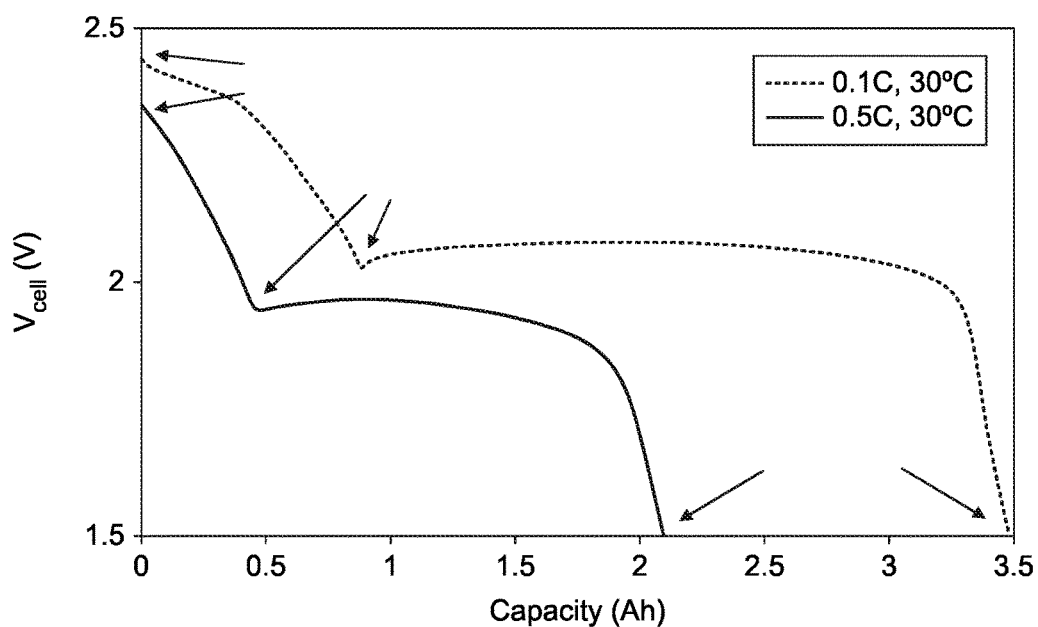
FIG. 12b plots the modelled discharge curves for the ECN adjusted by the simple memory model.

Compensating for this is achieved by the way in which the look up table from the equivalent circuit model for $R_o$ is read in use. If, in use, the cell voltage becomes less than the boundary voltage between the high and low plateaus, i.e. $V_{cell} \leq V_b$, then the position on the $R_o$ plot is found that corresponds to the same $R_o$ value (same amount of middle order polysulfide dissolved) in the low order plateau, as indicated by the dotted arrow in FIG. 12*a*. The effect of this adjustment in the modelled capacity when compensating based on the memory model is shown in FIG. 12*b*, which plots the modelled discharge curves for the ECN adjusted by the memory model. In detail, FIG. 12*a* shows reading the look-up table for $R_o$ as dictated by a simple memory model for a 0.1 C and a 0.5 C discharge rate. For the 0.1 C discharge curve, the reference look-up table is used (as this corresponds to the low enough current). However, it can be seen that at 0.5 C, where the cell voltage drops below the boundary voltage between the high and low plateaus, the mechanism of using the look up table to take into account the effect of discharge at a higher current as indicated by the dotted arrow, is required (i.e. the reading of the $R_o$ value from the plot skips to the corresponding $R_o$ value on the downward slope of the $R_o$ plot). As can be seen in FIG. 12*b*, as a result, at 0.5 C there is approximately 1.3 Ah temporary capacity loss compared to discharging at 0.1 C.

The value of the jump on the capacity axis indicated by the dotted arrow is taken as the temporarily lost capacity through inactivation of high order polysulfides.

Figure 14:
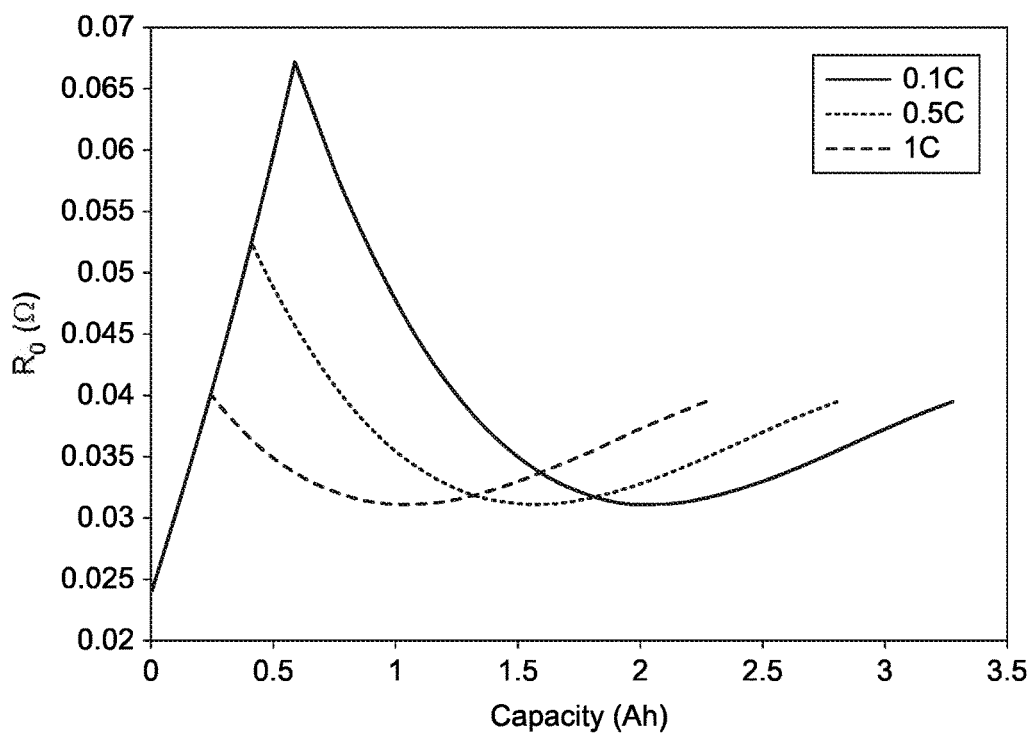
FIG. 14, which shows the comparative $R_o$ plots from adjusting the reading of the $R_o$ values for 0.1 C for different discharge rates.

As shown in FIG. 14, which shows the comparative $R_o$ plots from adjusting the reading of the $R_o$ values from the ECN cell model for 0.1 C for different discharge rates (0.5 C and 1 C), the higher the current, the more capacity is temporarily lost.

Figure 13:
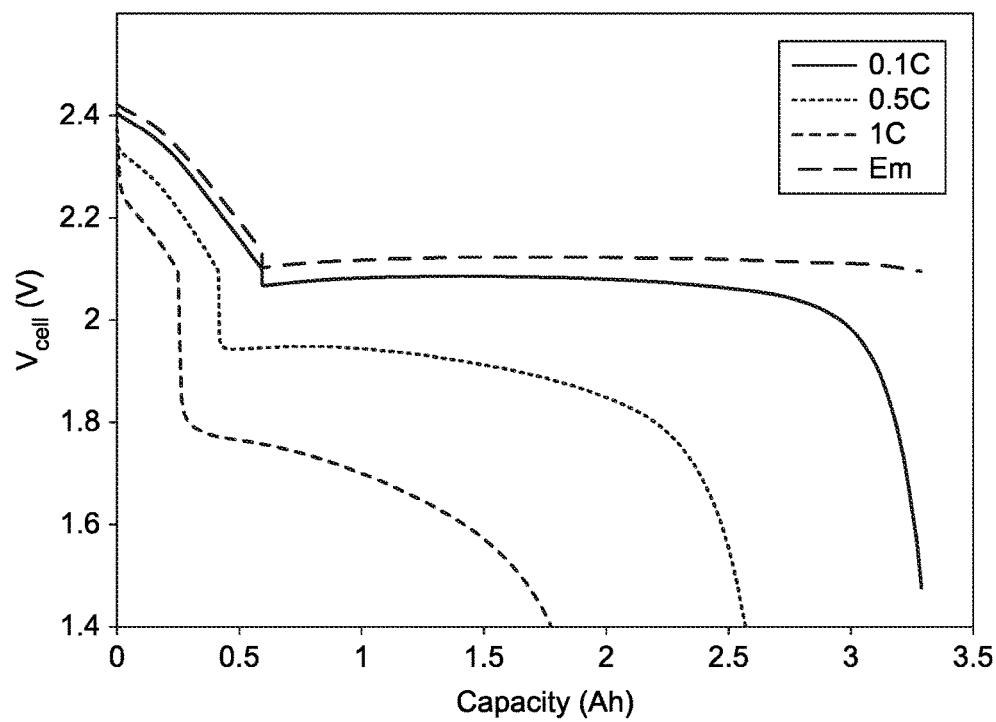
FIG. 13 shows discharge curves predicted by the ECN cell model adjusted by the simplified memory model to predict the variation of $Q_t$ with different current discharge rates.

The simplified memory model is parametrised by fitting $V_b$, the boundary between the high and the low plateaus, which can be estimated from a low current, constant current discharge. As shown in FIG. 13, this simplified memory model can be used to adjust the cell model to predict the variation of $Q_t$ with current.

In another more complex variation of the memory model, reactions as shown in Table 1 taking place independently of the presence of electronic current are added to the model, together with a necessary and sufficient set of additional states that represent active and inactive material at different stages of reduction in the polysulfide series. The number of species included in the model is chosen to be the minimum number to adequately describe the performance of a Lithium-Sulfur cell but generally includes redox reactions, chemical

TABLE 1

Representative LiS reaction mechanisms added to the memory model

High Plateau (Ca. 4 e⁻)

First Cycle, dissolution and 2
step reduction
$S_{8\,(s)} + 2e^- + 2Li^+ \rightarrow Li_2S_{8(Soln.)}$
Reductive Dissociation
$Li_2S_8 + 2e^- + 2Li^+ \rightarrow Li_2S_6 + Li_2S_2$
(or)
$Li_2S_8 + 2e^- + 2Li^+ \rightarrow 2Li_2S_4$
Low Plateau (12-n e⁻)

Chemical Equilibrium
$Li_2S_6 \leftrightarrow 2LiS_3 \cdot$ (radical)
Dominating low plateau
electrochemical reaction
$LiS_3 \cdot + e^- + Li^+ \rightarrow Li_2S_3$
Association and precipitation
$Li_2S_3 + Li_2S_4 \rightarrow Li_2S_6 + Li_2S_{(s)}$
And many other reactions
Inaccessible Capacity (n e⁻)

Equilibrium conc. of unreacted
intermediates
$Li_2S_{n\,(Soln.)} + Li_2S_{(S)}$
Irreversible Capacity Loss Polysulfide oxidation
Lithium solvent/salt reactions
SEI formation and re-formation
Loss of active surface area
Electrically isolated precipitation
And many other reactions inter-conversions such as association and dissociation of molecules, ions and radicals and any combination thereof in equilibrium.

A set of equations is constructed according to the procedure above. Parameterisation of this model requires electrochemical parameters for the reactions and species considered, such as those available in Assary et al, J Phys. Chem C 118 (2014) otherwise parameters can be predicted or fitted to experimental data.

Parameterisation by Prediction Error Minimisation (PEM)

An alternative method of cell and memory model generation and parameterisation that is computationally less expensive than the methods described above and that can therefore be used, e.g., to identify model parameters in real time within applications (as well as to identify parameters in experimental test data for cell model generation) is Prediction-Error Minimisation.

To identify the parameter values for a cell model, the parameters of the cell model (for the parameter value resource 512) are identified from inputs supplied from the application (i.e. cell operational condition measurement means 400) for example by prediction-error minimisation (PEM) (or a suitable alternative).

The identification procedure by PEM contains three main parts: 1) Model structure selection; 2) Fitting parameters to the model; and 3) Identification error minimisation. These parts will now be described in turn.

1) Model Structure Selection

Figure 15:
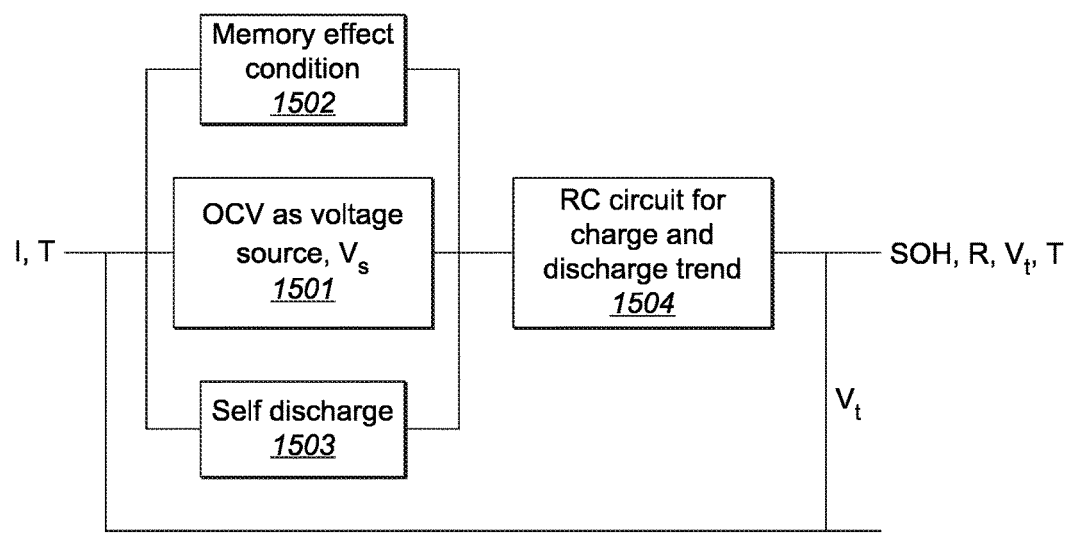
FIG. 15 shows an illustration of the general form of the equivalent circuit model for Lithium Sulfur batteries.

First, an equivalent circuit is selected using a combination of capacitors and resistors in series and or in parallel. FIG. 15 shows an illustration of the general form of the equivalent circuit model for Lithium Sulfur batteries. Here it can be seen that the general model includes a suitable open circuit voltage 1501 as a voltage source supplied from experimental test data or simulated from a high fidelity physical model of the Li—S cell that takes into account aging effects as described above, and shuttle effects. The open circuit voltage can be further modified by additional equivalent circuits of resistors and capacitors in series and or in parallel to include memory effects 1502 and self-discharge 1503 specific to Li—S batteries. A series RC circuit then adjusts the voltage source for the general trend of charge and discharge as a function of current load, I, and temperature, T. The model structure should be selected to balance accuracy and calculation complexity. The model then outputs a prediction of the SOC, SOH, internal resistance, R, of the cell, and terminal voltage, $V_t$. FIG. 7 represents the most basic example.

2) Fitting Parameters to the Model

Fitness criteria are chosen to fit the parameters of the model (i.e. the voltage source, ohmic resistance and diffuse resistance component values). One example approach is the identification procedure. The cell model parameters are determined so that the least difference between measured terminal voltage (from experimental or application data) and cell model output is achieved. The model parameter vector ($\theta$) is determined so that the prediction error ($\epsilon$), defined as follows, is minimized.

$$\epsilon(t_k,\theta) = y(t_k) - \hat{y}(t_k|t_{k-1};\theta)$$

where $y(t_k)$ is the cell's output at time k and $\hat{y}(t_k|t_{k-1};\theta)$ is the predicted value of the output at time k using the parameters $\theta$. The prediction error depends on the parameter vector so an iterative minimization procedure has to be applied. Consequently a scalar fitness function is minimized as follows:

$$E_N(\theta) = \det\left(\frac{1}{N}\sum_{k=1}^{N}\epsilon(t_k,\theta)\epsilon^T(t_k,\theta)\right)$$

3) Identification Error Minimisation

Figure 16A:
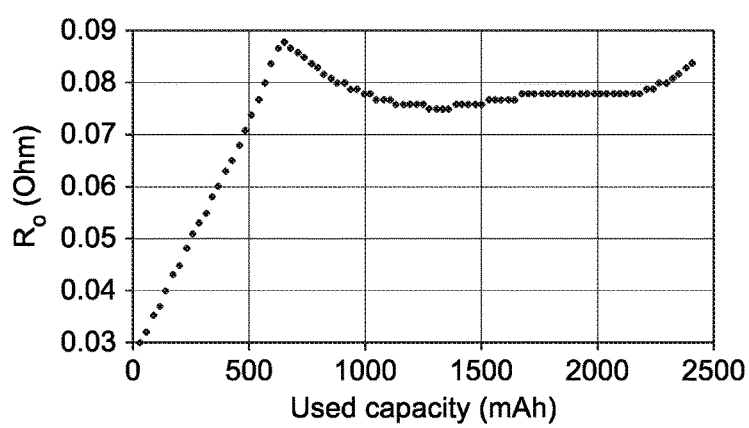
FIGS. 16a-d show evaluated RMSE values for the cell's voltage at different charge levels in a prediction error minimisation method, together with the identified parameter values.
Figure 16B:
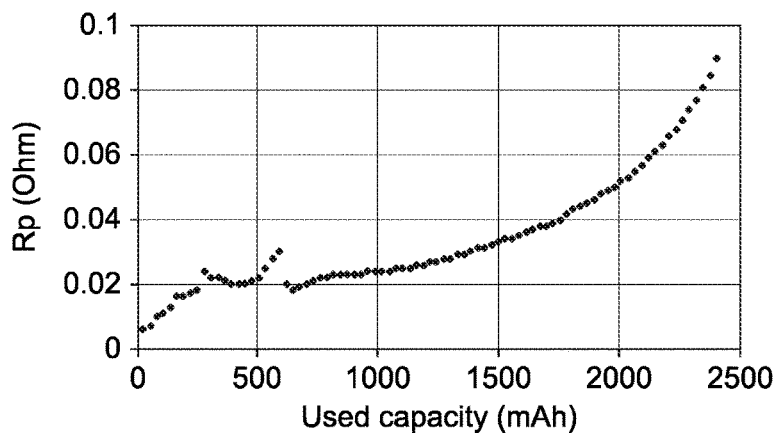
Figure 16C:
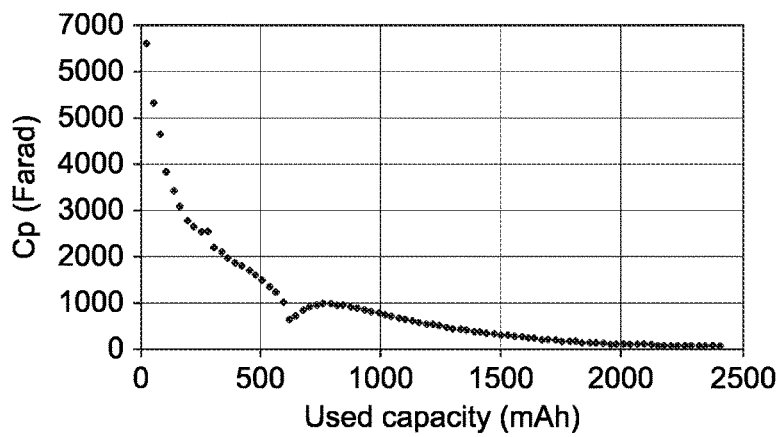
Figure 16D:
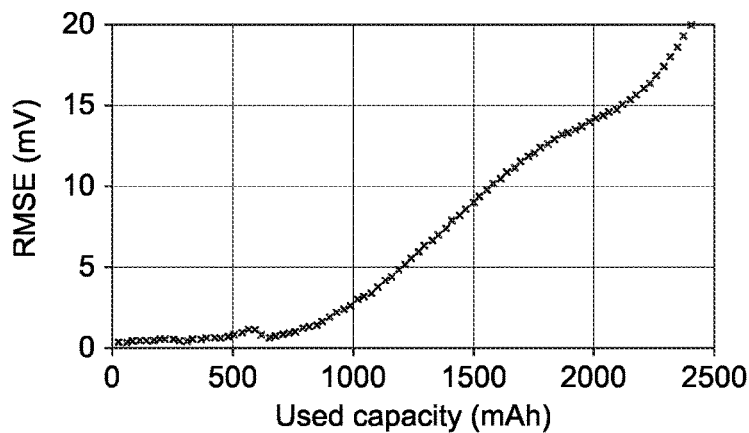

An identification error minimisation algorithm is selected, one example approach is where the average error of a cell's terminal voltage estimation is calculated using root mean square error (RMSE) criterion defined below.

$$RMSE = \left( \sum_{i=1}^{N} \frac{(V_{t,i} - \hat{V}_{t,i})^2}{N} \right)^{\frac{1}{2}}$$

where $V_t$ is the measured cell terminal voltage, $\hat{V}_t$ is cell model output and N is the length of $V_t$ in seconds. FIG. 16*d* shows RMSE values at different charge levels, together with the identified ECN model parameter values of $R_o$, $R_p$ and $C_p$ in FIGS. 16*a*, 16*b* and 16*c*, respectively.

Real-Time State of Charge Estimation Methods, using Kalman-Type Filters

Figure 17:
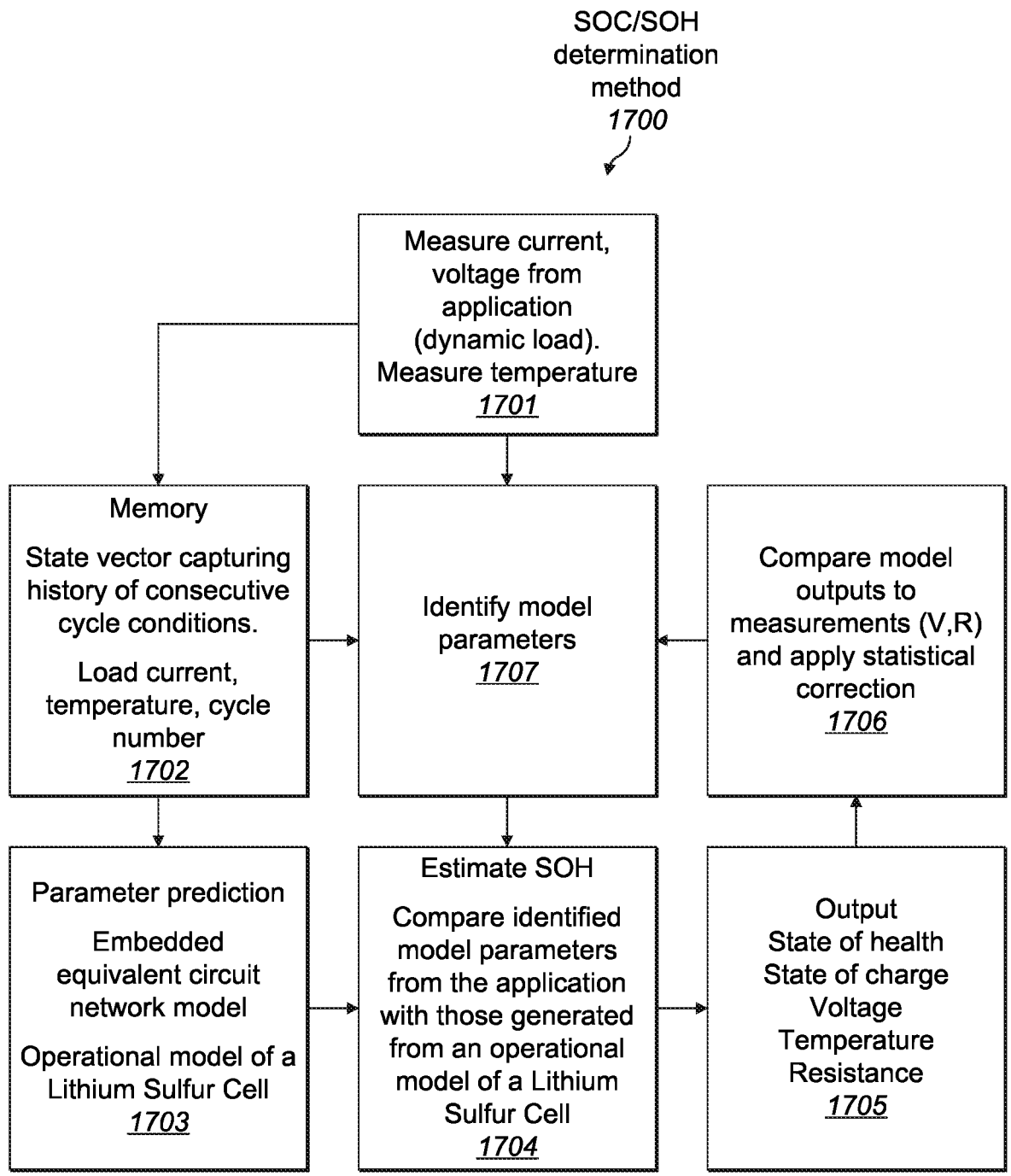
FIG. 17 which illustrates an example method of state of charge/state of health estimation in accordance with an embodiment of the invention.

Referring to FIG. 17, this illustrates an example method 1700 of state of charge estimation in accordance with an embodiment of the invention First, in step 1701, current, voltage and temperature are measured in use using cell operational condition measurement means 400 during dynamic load and in step 1702 these are stored in memory, where they are used to update a state vector that reflects the operational history of the cell in memory 513. The measured operational conditions in step 1701 are then input to the embedded equivalent circuit model in step 1703 along with the cumulative history of previous cycling conditions (for example, charge-discharge rate and temperature) stored in tables or as a state vector in operational history 513. The model parameters are then predicted in step 1703 (using the cell model module 532), for example by a PEM method.

Then based on experimentally derived or predicted look up tables from an operational model of a Lithium Sulfur cell in step 1704 the state of health is estimated (using the memory effect module 533) along with measurable parameters of the system such as voltage, temperature and resistance which are output in step 1705. In step 1706, these estimated outputs can be used in a feedback loop by comparison of estimated data with actual measured data to increase the accuracy in step 1707 of parameter estimation in real time.

Unlike similar systems for common battery types for Lithium Sulfur the equivalent circuit model additionally takes into account the unique memory effect in Lithium Sulfur cells which varies the maximum capacity, $Q_t$ on charge or discharge depending on temperature and cumulative effects of charge and discharge rates.

The memory aware model is deployed in the software or firmware of an application such that state of charge and state of health estimation does not rely on extensive calibration of standard cells or extensive high volumes of test data.

Indeed, in accordance with another embodiment of this invention, a model specific to the unique characteristics of Lithium Sulfur chemistry including the memory effects under dynamic load is generated from experimental data. An equivalent circuit model (or any alternative model such as any physics based cell model, semi or fully empirical) is implemented as part of a real-time embedded system within the application either as software or firmware. The current equivalent-circuit network model parameters are continuously identified in real time using the same approach for parameter identification and Kalman type filtering such as extended Kalman filter, the unscented kalman filter, the particle filter, Luenberger state estimator (observer) or any other state observer or state estimator variant to provide the cell state estimator 534. The algorithm update rates and numerical precision are traded off against processor cost as application needs dictate.

Figure 18:
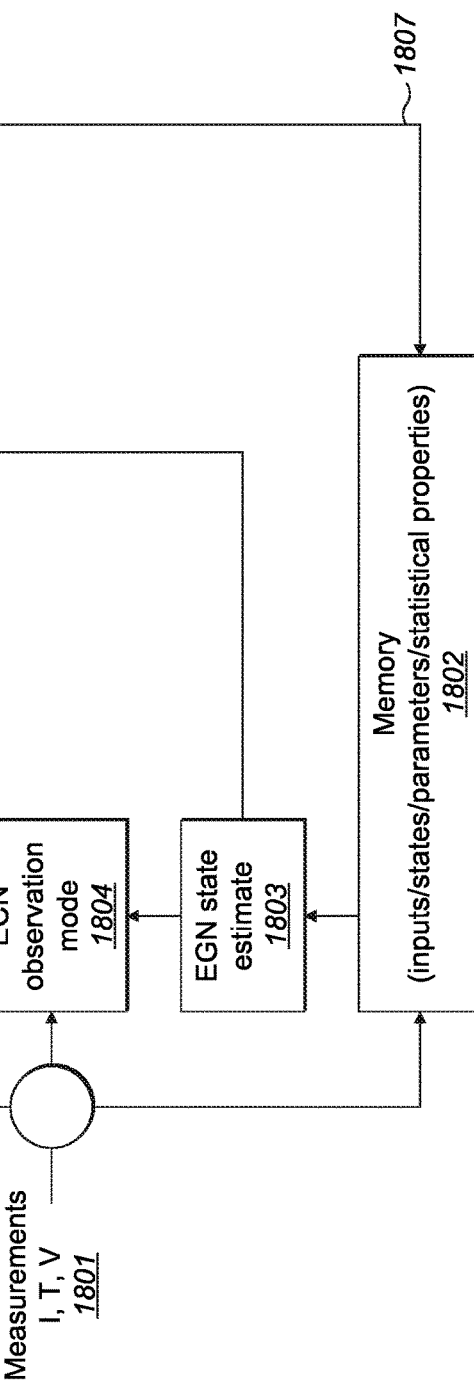
FIG. 18 shows a schematic illustration of a real time SOC/SOH estimation using an operational equivalent circuit model and Kalman filtering.

An example of such an implementation using a Kalman-type filter as a state estimator is illustrated in FIG. 18 which shows a schematic of a real time SOC/SOH estimation using an operational equivalent circuit model and Kalman filtering. Here, in 1801, measured values of current load, I, temperature, T, and terminal voltage V, are received from the cell operational condition measurement means 400 during dynamic load. As before, in 1802, these are passed to memory where they are used to update, e.g., a state vector representative of the historical operational conditions of the cell, and then on, in 1803, to the ECN state estimator module 534. In the prediction step of the Kalman filter, this state estimator 534 is used to predict the internal cell state at a given timestep in the future based on the current state, the SOC model 531, and the current operational conditions. The measurements at that future timestep received from the cell operational condition measurement means 400 are then used in the correction step of the Kalman filter. Firstly, the expected measured value is produced in 1804 by an ECN Observation model adjusting the ECN state predicted in 1803. This is then compared with the actual measured operational conditions in 1805 in a statistical adaptation model for the ECN that, using a Kalman gain, determines a statistical adaption value that is used in post-processing in 1806 to correct the predictions of the current cell state from the ECN model based on the observed cell behaviour, and which in 1807 is subsequently fed back to the memory to adjust and improve the ECN model in an iterative fashion. The algorithm architecture can be implemented in a number of ways. Example deployment architectures are shown in FIGS. 19-22.

Figure 19:
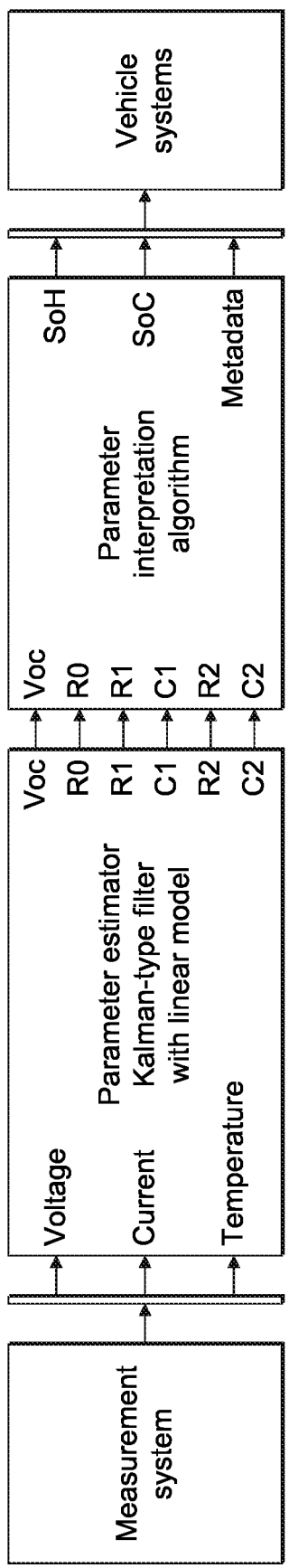
FIG. 19 shows an example system architecture for Parameter Estimation and Interpretation using a simple Kalman filter as a state estimator.

The simplest, shown in FIG. 19 uses a Kalman type filter to estimate or identify the current parameters of an equivalent-circuit network model, parameter estimates are interpreted against parameter look up tables generated from Lithium Sulfur cell models to estimate the current states of health (SoH) and charge (SOC).

Figure 20:
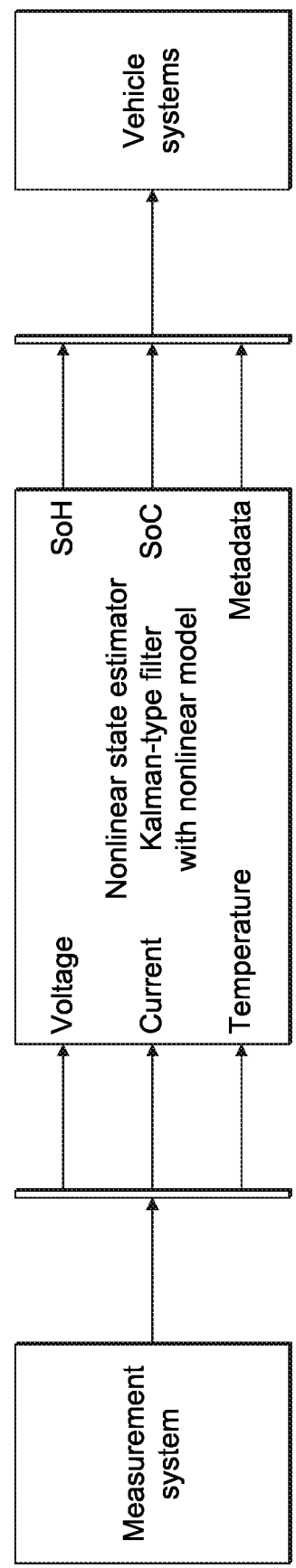
FIG. 20 shows an example system architecture for Parameter Estimation and Interpretation using a non-linear Kalman filter as a state estimator.
Figure 21:
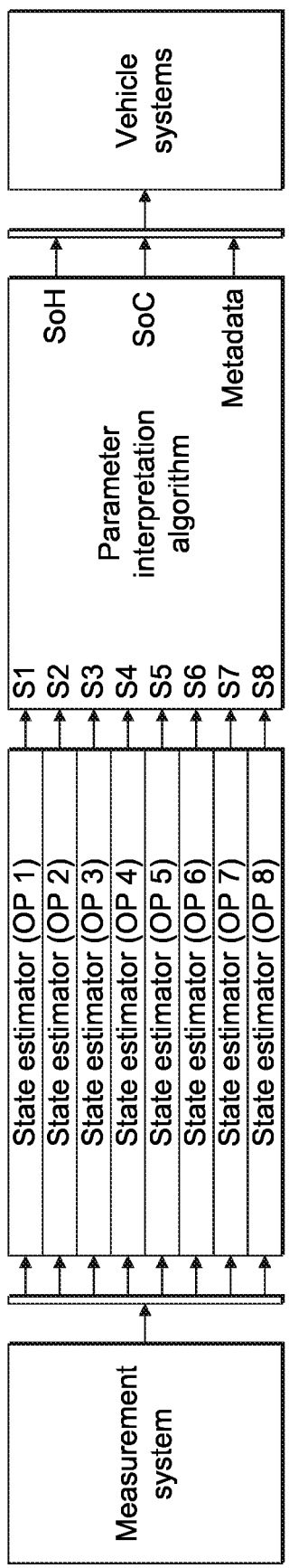
FIG. 21 shows an example system architecture for Parameter Estimation and Interpretation using Multiple Hypothesis filters as a state estimator.
Figure 22:
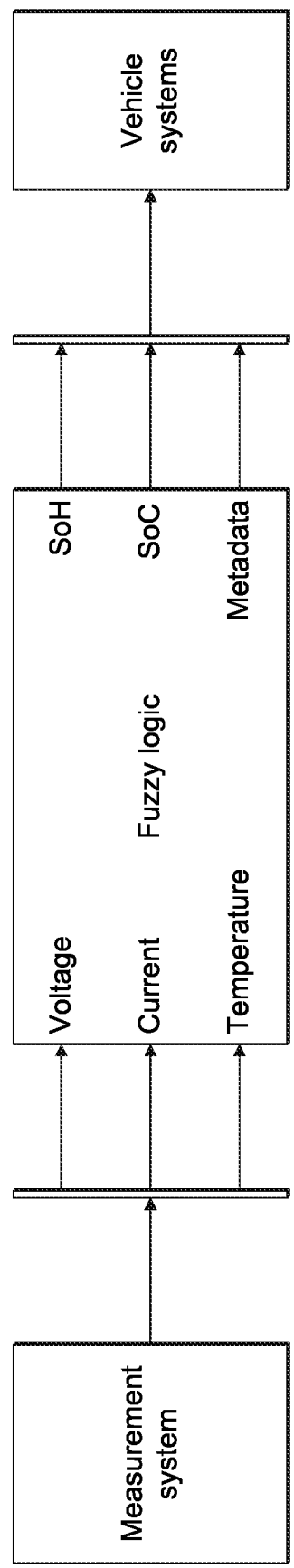
FIG. 22 shows an example system architecture for Parameter Estimation and Interpretation using Fuzzy Logic as a state estimator.

In a more complex form shown in FIG. 20, a non-linear Kalman filter can be used for non-linear state estimation of the equivalent circuit model and its associated memory effects. Other simplifications include multiple hypothesis filters which use relatively simple state estimators and then choose the most likely SOC or SoH based on prediction errors, as shown in the architecture in FIG. 21. An architecture using Fuzzy logic, as shown in FIG. 22, can also be employed for state estimation and trained by the Li—S model which incorporates an understanding of the memory effect.

In this case no database is required and the model's parameters are tuned continuously. Given real time inputs of for example voltage, current and temperature from the cell operational condition measurement means 400 the cell model can be used to predict the cell's terminal voltage.

Figure 23:
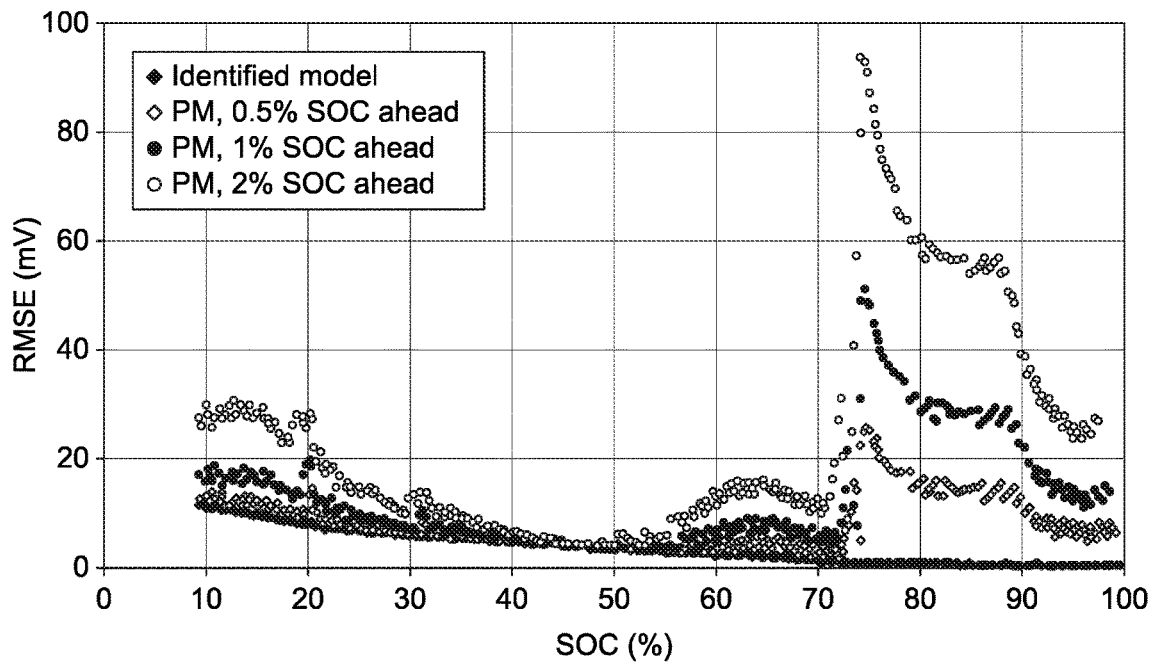
FIG. 23 shows the prediction results for various prediction horizons from 0.5 to 2% SOC increments using a simplified equivalent circuit.
Figure 24:
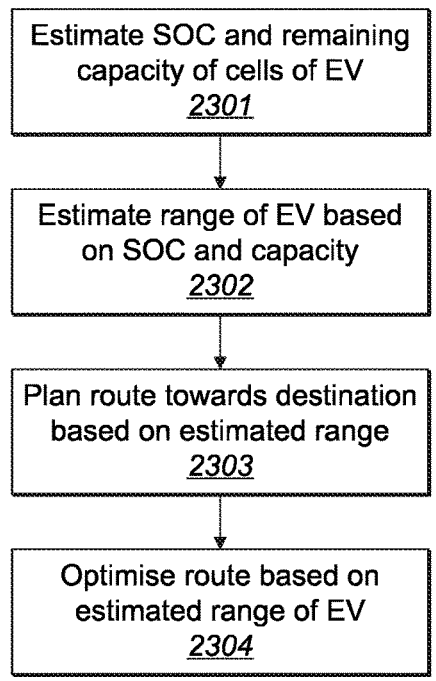
FIG. 24 is a flow diagram illustrating a method for estimating a range and planning a route of an electric vehicle in accordance with an embodiment of aspects of the invention.

The accuracy of the predictive model is balanced against computational effort for on-line model identification. For on-line prediction the model should be updated at regular intervals for a desired prediction horizon. The lower the prediction horizon the greater the accuracy. If there is no update delay then the RMSE would be equal to the identification model above. FIG. 23 shows the prediction results for various prediction horizons from 0.5 to 2% SOC increments using a simplified equivalent circuit. In the example increasing the prediction horizon from 1% to 2% SOC reduces computational effort by 50% whilst the average RMSE increases from 13 to 24 mV. The prediction horizon is selected based on SOC such that the update rate is proportional to the rate of power demand in a vehicle.

In accordance with one embodiment of this invention Lithium Sulfur specific lookup tables or algorithms are stored in the battery management system or energy system controller either integral to the battery system or within the application system as software or firmware. The lookup tables are populated using a software model specific to the unique characteristics of Lithium Sulfur chemistry including memory effects under dynamic load, parameterised from experimental data. The use of a model refers to an equivalent circuit model (or any alternative model such as any physics based cell model, semi or fully empirical). These lookup tables correlate cell resistance and voltage at various temperatures and currents relative to $Q_t$ (100% SOC or 100% SOD) which is determined when the terminal voltage reaches a predetermined cut off voltage. $Q_t$ at the '100% SOC/SOD' state is determined from the predicted available active material present in the cell derived from a stored cumulative history of the cells, modules or battery's prior charge/discharge rates, depths of charge/discharge and temperature profile in order to accurately predict the maximum charge or discharge capacity for the current charge or discharge cycle. Feedback is provided by measurement of current, voltage and calculated resistance using the cell balancing resistors. Cell impedance is measured through the switching of a balancing resistor. Consecutive current pulses are imposed to the cell by switching in and out a cell balancing resistor and the cell's terminal voltage is measured. The test can be performed at any state of charge when the application is idle. The sampling rate can vary between 0.1 seconds and 60 minutes. Each current pulse is followed by enough relaxation time (1 second to 60 seconds) for the battery terminal voltage to return to open circuit voltage $V_{oc}$ and/or a steady state. In this way state estimation does not require extensive calibration and can be updated in real time based on data captured during application under dynamic loads.

In accordance with another embodiment of this invention this model is deployed in a real time battery management system or energy system controller. A typical form of this model could be a look up table which returns model parameters based on a number of inputs including SOC, current amplitude, temperature and requiring high volumes of test data for all conditions.

This approach to terminal voltage prediction for SOH estimation that is generally applicable to multiple cell types given similar trend in discharge/charge characteristics. This approach can be used for any cell chemistry and design. It is also a method of coupling high fidelity predictions from physical models that include all complex features of a lithium sulfur cell to simpler embedded models whose parameters can be identified in real time within the battery management system or energy system controller of an application due to the reduced computational effort required. High fidelity predictive models can be developed from the first principles of fundamental physical theory to describe the performance of a lithium sulfur cell exposed to external stimuli. These models that predict the effects of chemistry, materials, cell build, cell design and operating conditions. The output from the high fidelity physical models of a lithium sulfur cell take into account features such as shuttle and degradation mechanisms, to improve SOH estimation. In this way high fidelity models can be used to parameterise simpler embedded models for a range of experimental conditions alongside applied current and temperature in order to predict state of health, resistance, voltage and resulting temperature. The embedded model is used to predict internal states that cannot be measured directly or virtual states (such as SOH and SOC) given the operating history of the cell (for example current and temperature profile) either in real time or ex-situ.

As can be seen from the foregoing, according to the present invention by including the memory effect brought about by the dissolution of intermediate species in the electrolyte in a device embedded equivalent circuit model (or other model types such as physics based or semi-empirical physics inspired models including fully empirical cell models) along with the effects of self-discharge, shuttle and other aging mechanisms specific to Lithium Sulfur batteries and detecting current, temperature, internal resistance to provide feedback, the SOH of the system can be detected in real time and under dynamic cycling conditions. This software/firmware solution can be implemented without adding additional standalone devices to battery management systems for state estimation.

As will be appreciated from the below, the provision of the above apparatus and method for reliably estimating the state of charge and state of health of cells, such as LiS cells, that suffer from the memory effect, into a battery management system or energy system controller of an electric vehicle (EV) powered at least in part by said cells allows improved range estimation and route planning to be performed in relation to the use of the electric vehicle. This is illustrated with reference to FIG. 23, reference to which will now be made.

In an exemplary embodiment, a method 2300 for estimating a range and planning a route of an electric vehicle therefore includes, in step 2301, performing a method as described above to estimate a state of charge and a remaining capacity of the cells in use.

Then, in step 2302, the method further includes estimating a range of the electric vehicle based the estimation of the state of charge and the remaining capacity of the cells in use.

Then, in step 2303, the method further comprises planning a route towards a desired destination based at least in part on an estimated range of the electric vehicle produced by the range estimation module based on the predicted operational conditions of the cells following that route. This may be performed using route planning algorithms adapted to in 2304 optimise a route towards a destination from plural routes planned by the route planning module based on the estimated range of the vehicle along those routes, and optionally other information such as recharge or battery-swapping points along those routes. In addition, as the estimation of the remaining capacity may be based on the predicted operational conditions of the cells in use in the vehicle, for example, over a given predicted route, for a given driving style of the driver on that route, for given environmental conditions on that route, etc, the range estimation and route planning algorithm can solve, e.g. iteratively, over these factors to recommend the optimal route for the driver to follow to reach a given destination. Typically the route selection will be optimised based on conserving capacity needed for completing a given journey, although alternatively greater weight can be given to optimising for the speed of completing a journey, or other criteria.

While this invention has been described in connection with what is considered to be the most practical and preferred embodiments, it is to be understood that this invention is not limited to the disclosed embodiment and the drawings, but on the contrary, it is intended to cover various modifications and variations within the spirit and scope of the appended claims. Various types of circuitry and devices can be used to implement the measurement system as described according to this invention. It will be understood that this is illustrative and that various modifications can be made by those skilled in the art without departing from the scope and spirit of this invention. This invention is only limited by the claims that follow.

The invention claimed is:

1. An apparatus for modelling a state of charge of a secondary electrochemical cell having a Lithium Sulfur chemistry where capacity can be lost due to active reactant species in an electrolyte of the cell becoming temporarily inactive in use, the apparatus comprising:
a cell model module operable to predict electrical characteristics of the Lithium Sulfur cell in use based on a model representative of an internal state of the cell that correlates a terminal voltage of the cell to an operational condition of the cell for all states of charge; and
a memory effect module operable to model usable capacity of the Lithium Sulfur cell in use based on a memory model representative of the variation in amount of active reactant species in the electrolyte of the cell due to variation in an amount of the active reactant species in the electrolyte of the cell becoming temporarily inactive in use, wherein the memory model predicts a proportion of a rated capacity of the cell, $Q_r$, that is usable capacity, $Q_{usable}$, during use based on an operational history of the cell, wherein the operational history of the cell includes one or more of a temperature of the cell corresponding to a previous charge or discharge cycle of the cell, a charge rate of the cell corresponding to the previous charge cycle of the cell or a discharge rate of the cell corresponding to the previous discharge cycle of the cell, and depth of charge of the cell corresponding to the previous charge cycle of the cell or depth of discharge of the cell corresponding to the previous discharge cycle of the cell, thereby accounting for reversible variation in usable capacity of the cell due to active reactant species in the electrolyte of the cell becoming temporarily inactive in use,
wherein the cell model module and/or the memory effect module adjusts the cell model module in use based on the operational history of the Lithium Sulfur cell to compensate for the prediction of the usable capacity of the cell by the memory effect module.

2. The apparatus of claim 1, wherein the operational condition of the cell includes one or more of: a deemed open circuit voltage of the cell, a current load on the cell, a temperature of the cell, and an internal resistance of the cell.

3. The apparatus of claim 1, wherein the model representative of the internal state of the cell is an equivalent circuit network model comprising a number of modelled electrical elements, and wherein the equivalent circuit network model being parameterised by the properties of the constituent electrical elements of the equivalent circuit network model.

4. The apparatus of claim 3, wherein the equivalent circuit network model consists of a voltage source and is in series with an ohmic resistance and one or more diffuse resistances represented as RC pairs.

5. The apparatus of claim 4, wherein the equivalent circuit network models the cell behaviour by a deemed open circuit voltage of the cell being taken as the voltage source, and wherein the parameterised properties of the ohmic and diffuse resistances are selected to drop the voltage in the circuit down to the terminal voltage of the cell under a given current load and temperature, at a given state of charge.

6. The apparatus of claim 1, wherein the model representative of the internal state of the cell is a parameterised physics-based cell model.

7. The apparatus of claim 3, further comprising a parameter value resource adapted to be usable to provide values for the parameters of the cell model for the modelled behaviour of the cell at the given operational conditions to the cell model module.

8. The apparatus of claim 7, wherein the parameter values for the cell model are dependent on the modelled state of charge of the cell.

9. The apparatus of claim 7, wherein the parameter values for the cell model are derived empirically or semi-empirically based on tests of standard cells.

10. The apparatus of claim 7, wherein the parameter values for the cell model are stored in a parameter value resource as a lookup table.

11. A method for estimating a state of charge of a secondary cell having a Lithium Sulfur chemistry in use where capacity can be lost due to active reactant species in an electrolyte of the cell becoming temporarily inactive in use, the method comprising:
receiving measurements of operational conditions of the cell in use;
estimating an internal state of the cell in use, the estimating comprising:
modelling the cell using a cell model module that estimates electrical characteristics of the cell in use based on a model representative of the internal state of the cell that correlates a terminal voltage of the cell to an operational condition of the cell for all states of charge;
predicting usable capacity of the cell in use based on a memory model representative of a variation in amount of active reactant species in the electrolyte of the cell due to variation in an amount of the active reactant species in the electrolyte of the cell becoming temporarily inactive in use, wherein the memory model correlates a proportion of a rated capacity of the cell, $Q_r$, that is usable capacity, $Q_{usable}$, during use based on an operational history of the cell, wherein the operational history of the cell includes one or more of a temperature of the cell corresponding to a previous charge or discharge cycle of the cell, a charge rate of the cell corresponding to the previous charge cycle of the cell or a discharge rate of the cell corresponding to the previous discharge cycle of the cell, and depth of charge of the cell corresponding to the previous charge cycle of the cell or depth of discharge of the cell corresponding to the previous discharge cycle of the cell, thereby accounting for reversible variation in usable capacity of the cell due to active reactant species in the electrolyte of the cell becoming temporarily inactive in use;
adjusting the cell model module in use based on the operational history of the cell to compensate for the prediction of the usable capacity of the cell by the memory effect module; and
estimating the internal state configuration of the cell model that fits the received measurements of the operational conditions of the cell; and
estimating, based on the estimated internal state configuration of the cell, the state of charge of the cell.

12. The method of claim 11, further comprising:
estimating state of health of the cell as a ratio of the modelled usable capacity of the cell, $Q_{usable}$, to the rated capacity of the cell, $Q_r$.

13. The method of claim 11, further comprising:
refining the estimated internal state of the cell at each time interval by operating as an iterative feedback loop in which a prediction of the internal state of the cell based on the cell model projecting forward the estimated internal state of the cell at the previous time interval to the current time interval is corrected based on the measured operational conditions of the cell to update the estimate of the current internal state of the cell.

14. The method of claim 13, further comprising:
using a kalman-type filter to estimate the internal state of the cell at each time interval, wherein kalman-type filter is a kalman filter, an extended kalman filter, an unscented kalman filter, a particle filter, or a Luenberger state estimator.

15. The method of claim 11, further comprising:
using a prediction error minimisation technique to identify estimates of parameters of the cell model representative of the internal state of the cell in use.

16. The method of claim 11, further comprising:
solving a set of fuzzy logic rules to identify estimates of parameters of the cell model representative of the internal state of the cell in use.

17. The method of claim 11, wherein the measurements of the operational conditions of the cell received by a cell operational condition monitor module in use include one or more of: a terminal voltage of the cell, a current load on the cell, a temperature of the cell, and an internal resistance of the cell.

18. The method of claim 11, operating in a battery management system including multiple cells or an energy system controller adapted to couple to multiple cells.

19. The method of claim 11, wherein the plurality of secondary electrochemical cells are arranged to power a vehicle, the method further comprising:
estimating a range of the electric vehicle based the estimation of the state of charge and a remaining capacity of the cells in use and the predicted operational conditions of the cells in use in the vehicle.

20. The method of claim 19 further comprising:
planning a route towards a desired destination based at least in part on an estimated range of the electric vehicle and based on the predicted operational conditions of the cells following that route.

21. An apparatus for modelling a state of charge of a secondary electrochemical cell having a Lithium Sulfur chemistry where capacity can be lost due to active reactant species in an electrolyte of the cell becoming temporarily inactive in use, the apparatus comprising:
a processor; and
a memory adapted to store logic, which when executed by the processor causes the processor to:
predict electrical characteristics of the Lithium Sulfur cell in use based on a cell model representative of an internal state of the cell that correlates a terminal voltage of the cell to an operational condition of the cell for all states of charge; and
model usable capacity of the Lithium Sulfur cell in use based on a memory model representative of the variation in amount of active reactant species in the electrolyte of the cell due to variation in an amount of the active reactant species in the electrolyte of the cell becoming temporarily inactive in use, wherein the memory model predicts a proportion of a rated capacity of the cell, $Q_t$, that is usable capacity, $Q_{usable}$, during use based on an operational history of the cell, wherein the operational history of the cell includes one or more of a temperature of the cell corresponding to a previous charge or discharge cycle of the cell, a charge rate of the cell corresponding to the previous charge cycle of the cell or a discharge rate of the cell corresponding to the previous discharge cycle of the cell, and depth of charge of the cell corresponding to the previous charge cycle of the cell or depth of discharge of the cell corresponding to the previous discharge cycle of the cell, thereby accounting for reversible variation in usable capacity of the cell due to active reactant species in the electrolyte of the cell becoming temporarily inactive in use,
wherein the cell model in use is adjusted based on the operational history of the Lithium Sulfur cell to compensate for the prediction of the usable capacity of the cell.

* * * * *